United States Patent
Shirai et al.

(12)

(10) Patent No.: US 6,365,843 B1
(45) Date of Patent: Apr. 2, 2002

(54) MULTILAYER PRINTED WIRING BOARD

(75) Inventors: Seiji Shirai; Kenichi Shimada; Motoo Asai, all of Ibi-gun (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/582,665

(22) PCT Filed: Dec. 24, 1998

(86) PCT No.: PCT/JP98/05932

§ 371 Date: Jun. 29, 2000

§ 102(e) Date: Jun. 29, 2000

(87) PCT Pub. No.: WO99/34655

PCT Pub. Date: Jul. 8, 1999

(30) Foreign Application Priority Data

| Dec. 29, 1997 | (JP) | ............................................. | 9-369242 |
| Dec. 29, 1997 | (JP) | ............................................. | 9-369243 |
| Dec. 29, 1997 | (JP) | ............................................. | 9-369244 |
| Dec. 29, 1997 | (JP) | ............................................. | 9-369245 |

(51) Int. Cl.$^7$ ........................... H01R 12/04; H05K 1/11
(52) U.S. Cl. ........................ 174/262; 174/255; 174/256; 174/258; 174/259; 174/264; 361/792; 361/795; 361/803
(58) Field of Search ................................ 174/262, 255, 174/256, 258, 259, 261, 264, 263, 265, 266; 361/792, 793, 794, 795, 748, 803

(56) References Cited

U.S. PATENT DOCUMENTS 5,055,321 A * 10/1991 Enomoto et al. ............. 427/98
5,517,758 A * 5/1996 Nakamura ................... 29/852
5,589,250 A * 12/1996 Asai et al. ................... 428/209
5,590,461 A * 1/1997 Ishida ......................... 29/830
5,662,987 A * 9/1997 Mizumoto et al. .......... 428/209
6,121,553 A * 9/2000 Shinada et al. ............. 174/259
6,127,633 A * 10/2000 Kinoshita ................... 174/259
6,217,987 B1 * 4/2001 Ono et al. ................... 428/209

FOREIGN PATENT DOCUMENTS

| JP | 2-36591 | 2/1990 |
| JP | 2-188992 | 7/1990 |
| JP | 5-218645 | 8/1993 |
| JP | 7-79078 | 3/1995 |
| JP | 7-245484 | 9/1995 |
| JP | 8-242077 | 9/1996 |

* cited by examiner

Primary Examiner—Jeffrey Gaffin
Assistant Examiner—I B Patel
(74) Attorney, Agent, or Firm—Pillsbury Winthrop LLP

(57) ABSTRACT

A filled-via structure multilayer printed wiring board is provided which exhibits excellent reliability of the connection between via holes. An opening 42 formed in a lower interlaminer resin insulating layer 40 is filled with plated metal 48 so that a lower via hole 50 having a flat surface is formed. An opening 62 is formed in an interlaminer resin insulating layer 60 above the lower via hole 50 so that an upper via hole 70 is formed. Since the lower via hole 50 has a flat surface and resin is not residual on the surface, the reliability of the connection between the lower via hole 50 and the upper via hole 70 can be maintained. Since the lower via hole 50 has a flat surface, the smoothness and flatness of the surface of the multilayer printed wiring board can be maintained even if the upper via hole 70 is superimposed on the lower via hole 50.

21 Claims, 23 Drawing Sheets

FIG. 2
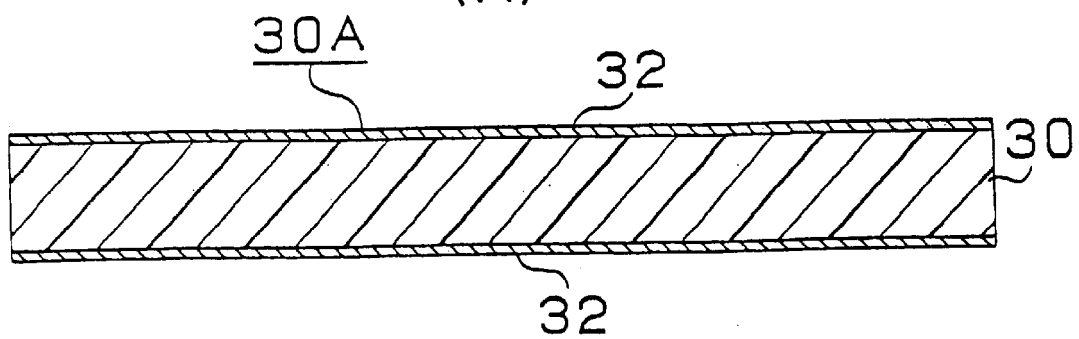
(A)
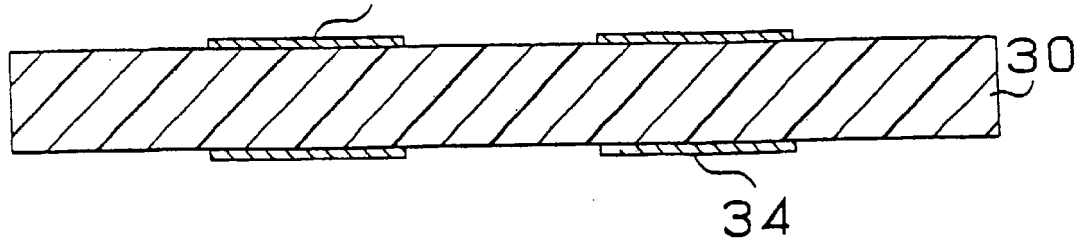
(B)
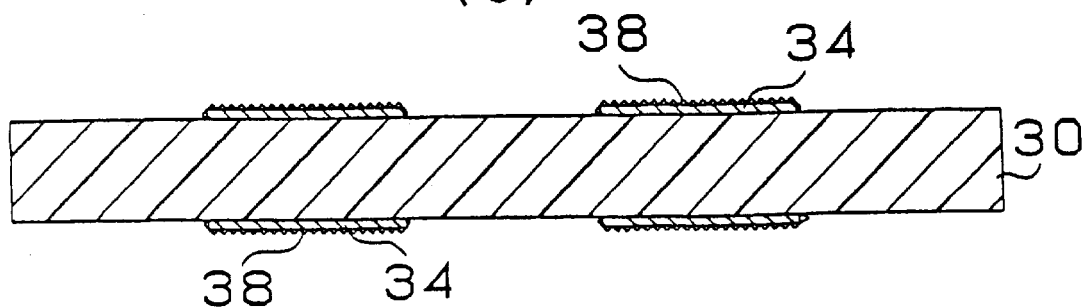
(C)
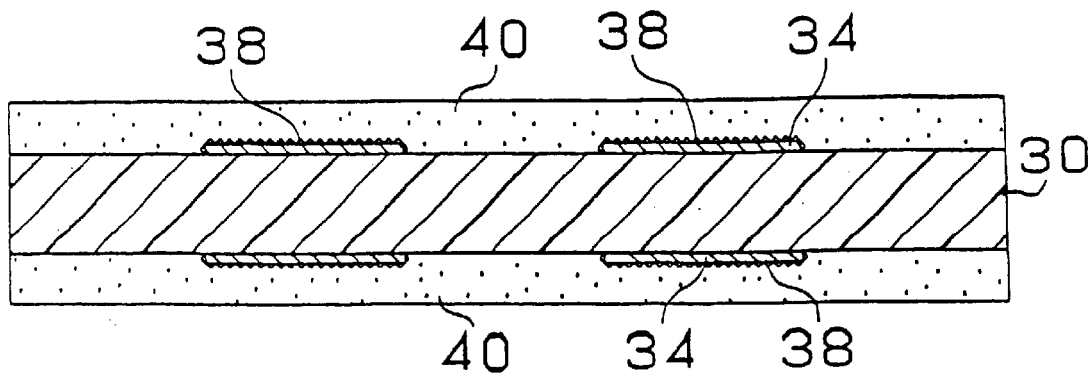
(D)

FIG. 2
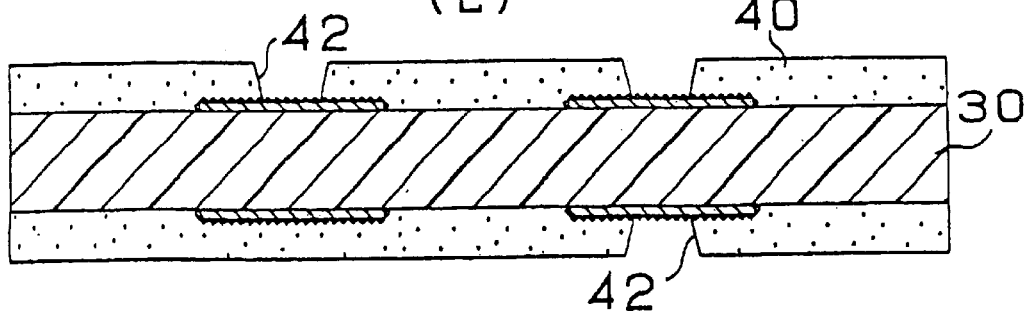
(E)
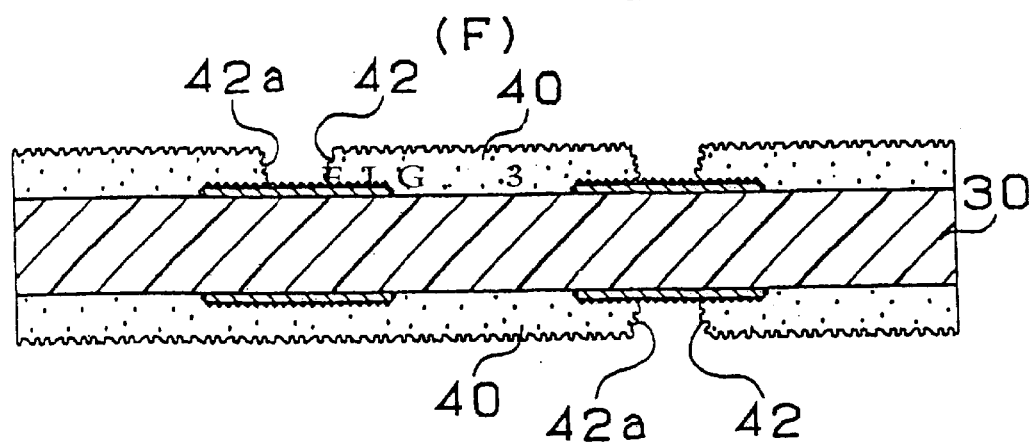
(F)
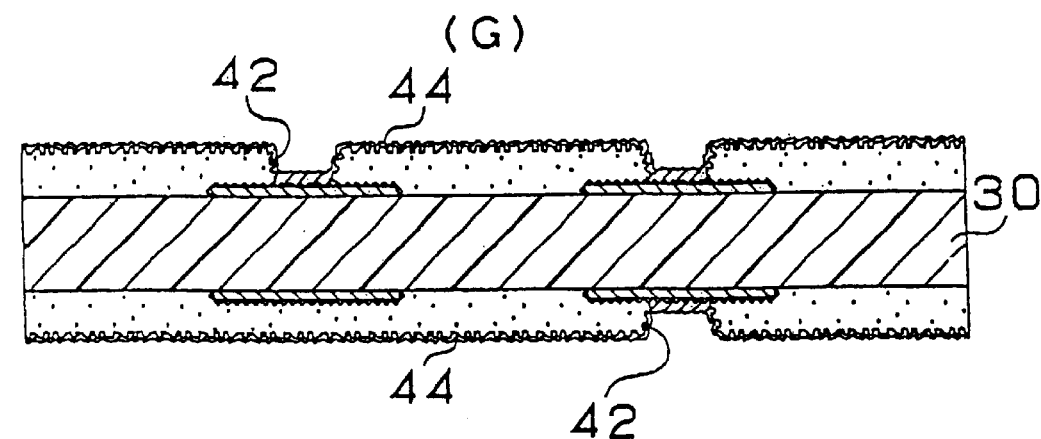
(G)
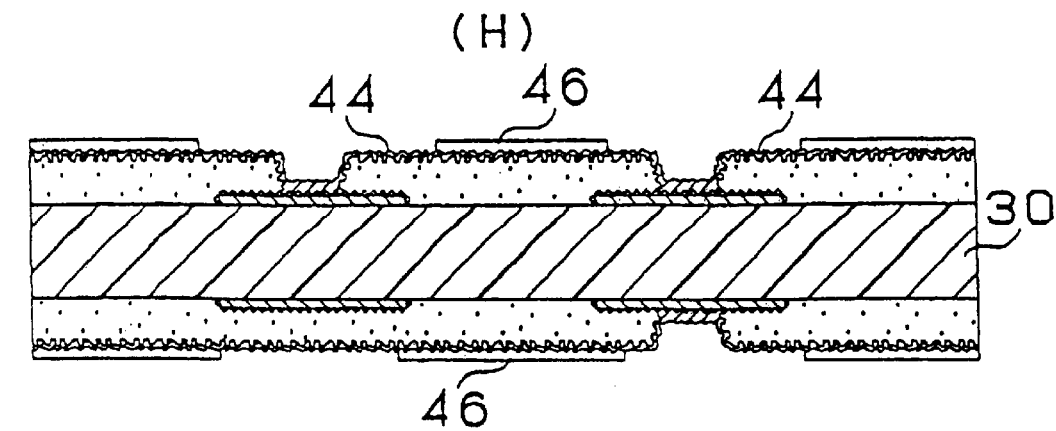
(H)

FIG. 2
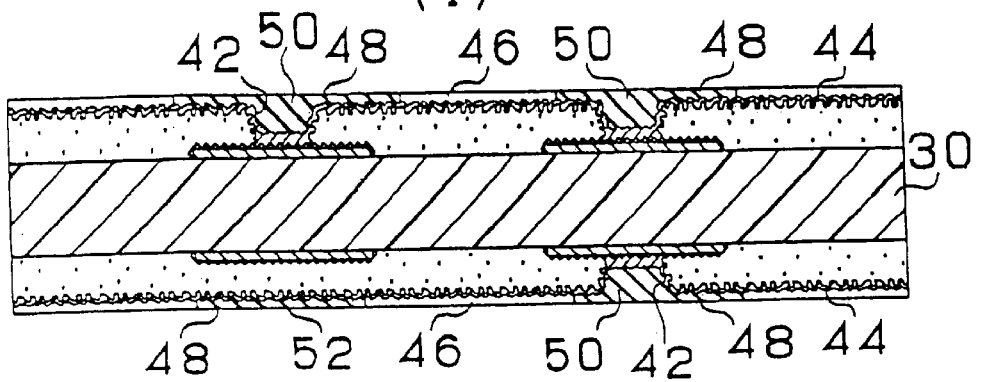
(I)
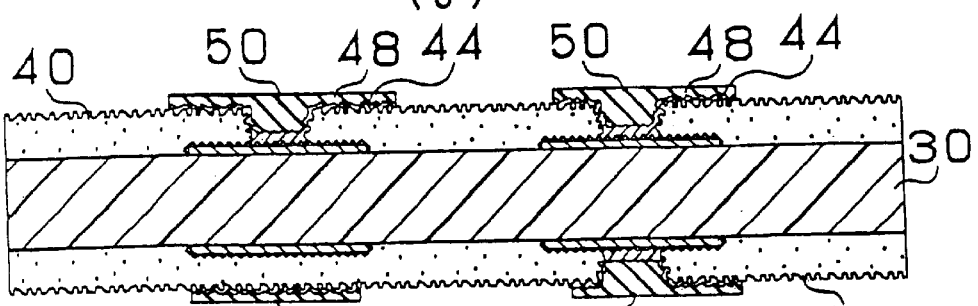
(J)
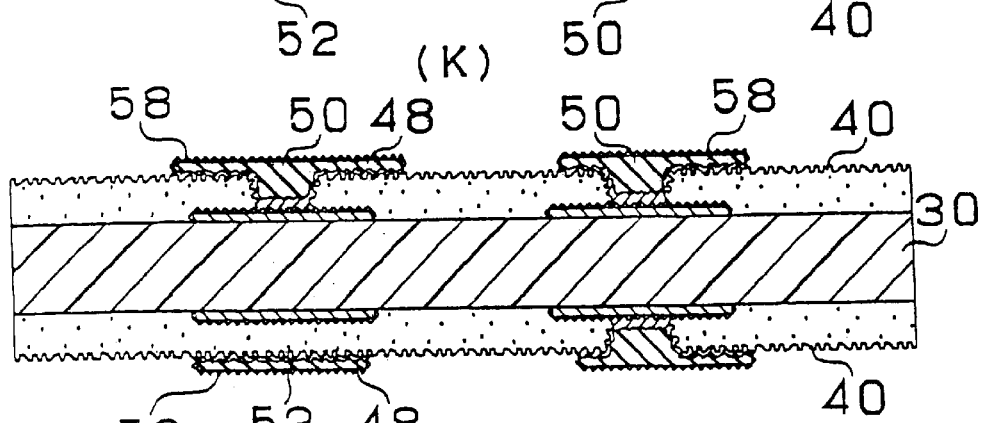
(K)
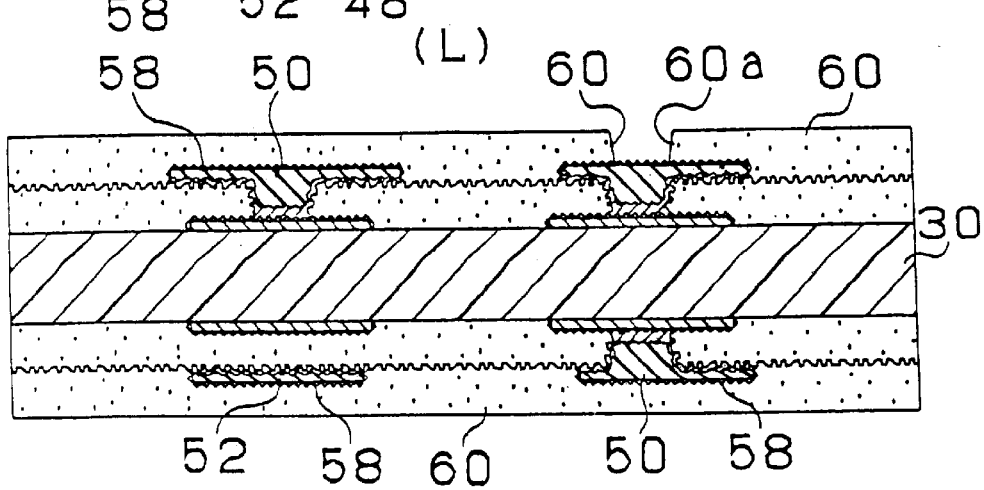
(L)

FIG. 2
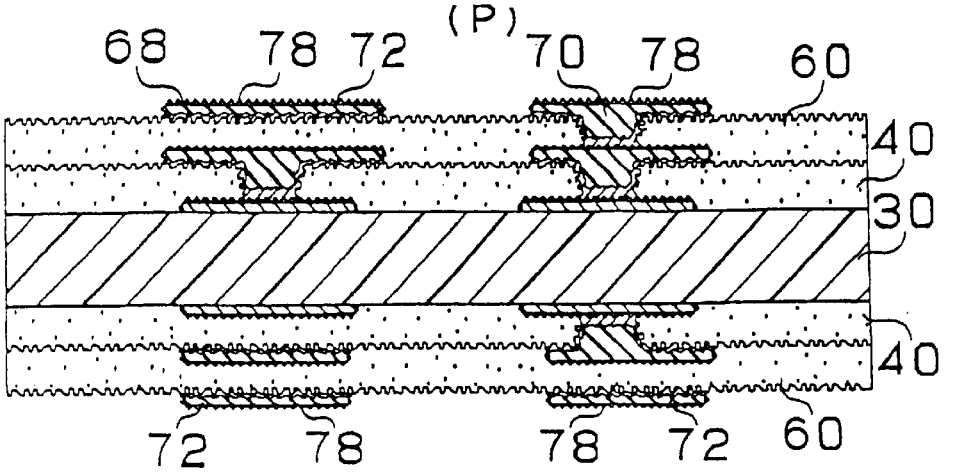
(P)
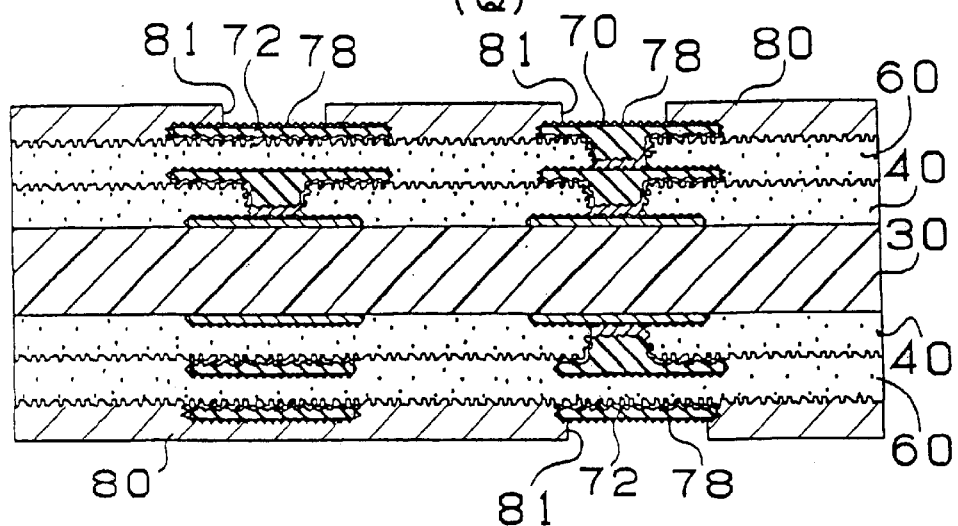
(Q)
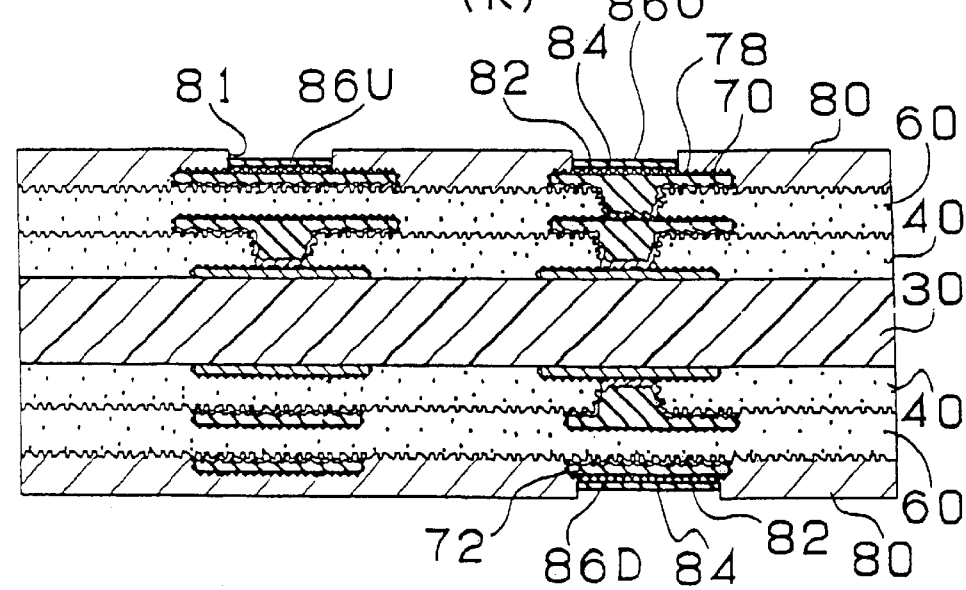
(R)

FIG. 4
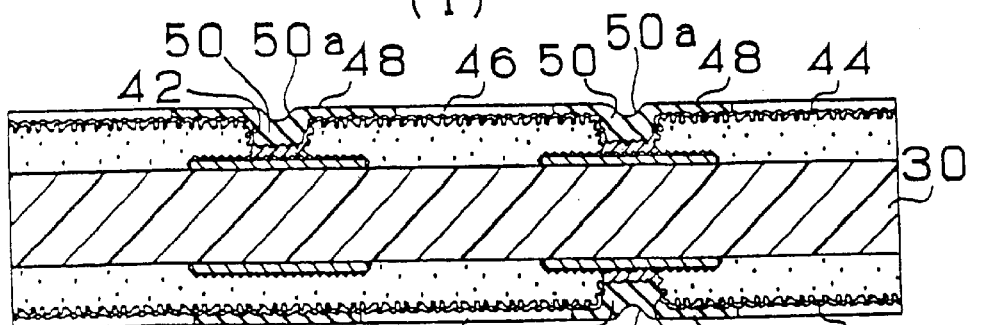
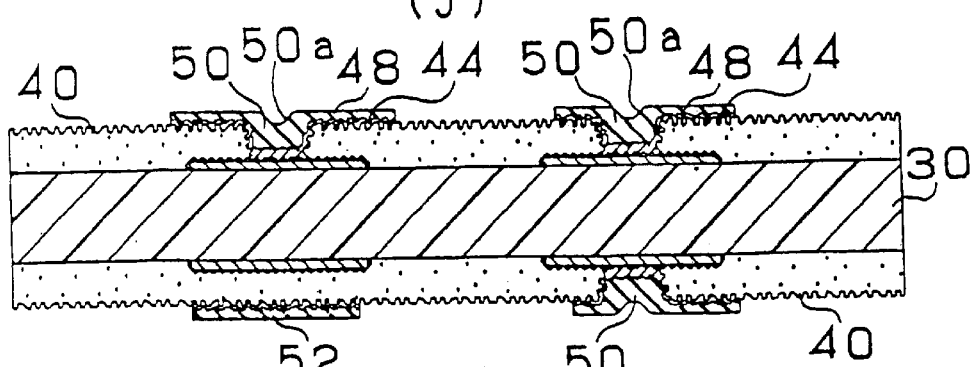
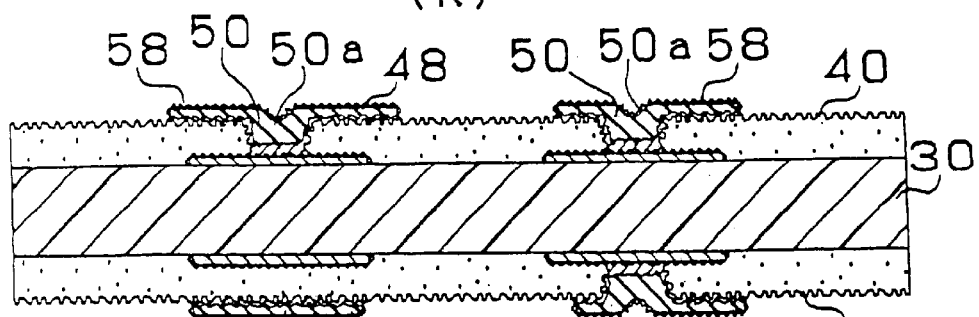
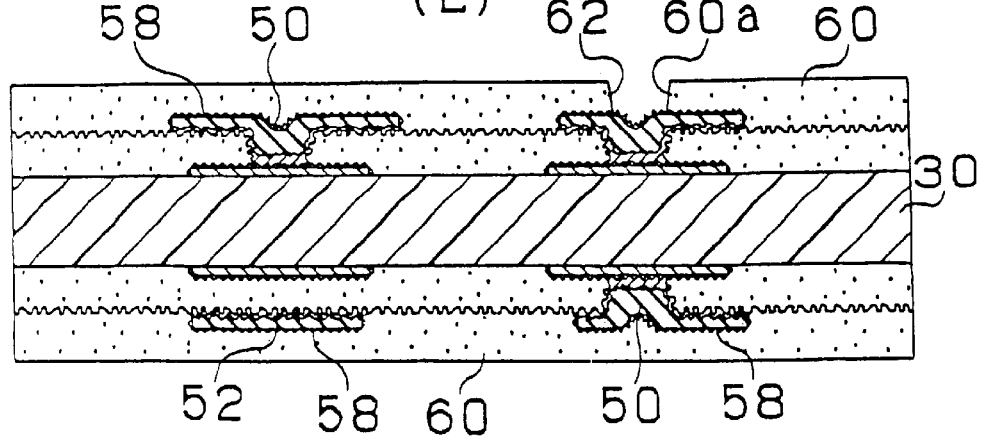

FIG. 4
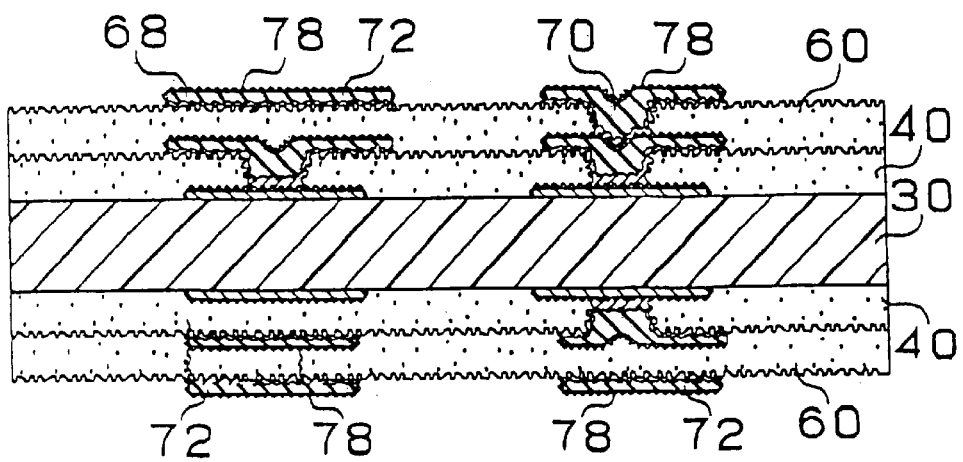
(P)
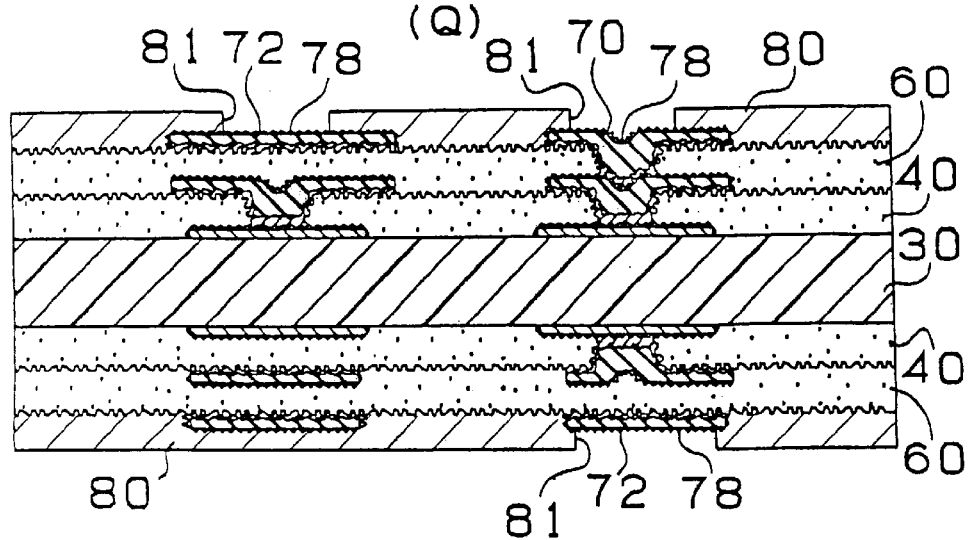
(Q)
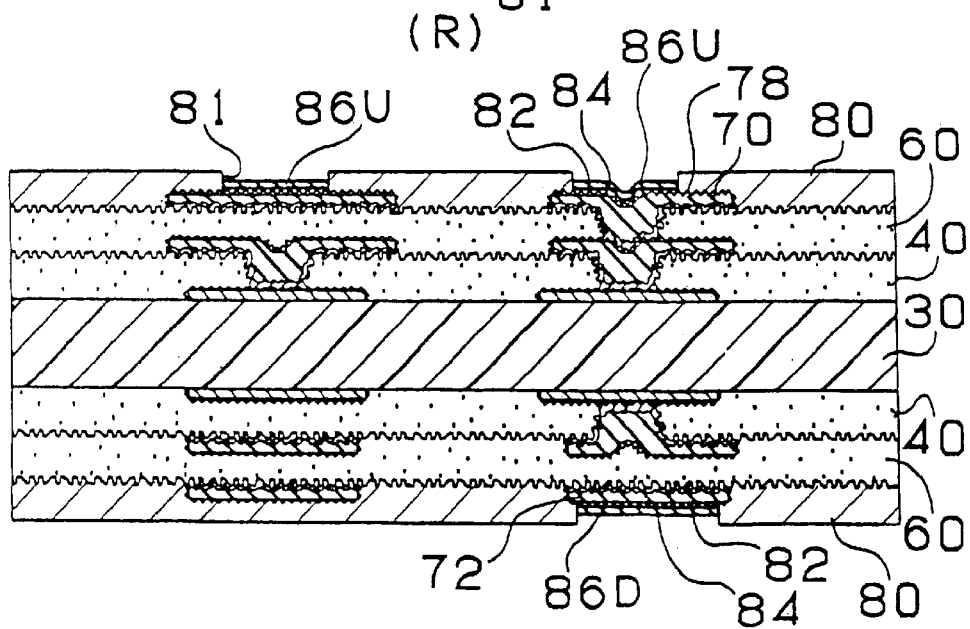
(R)

FIG. 7
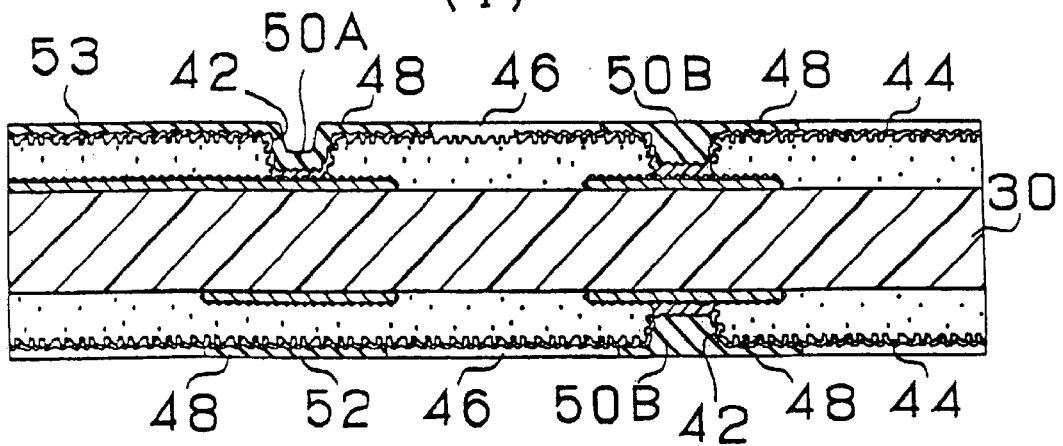
(I)
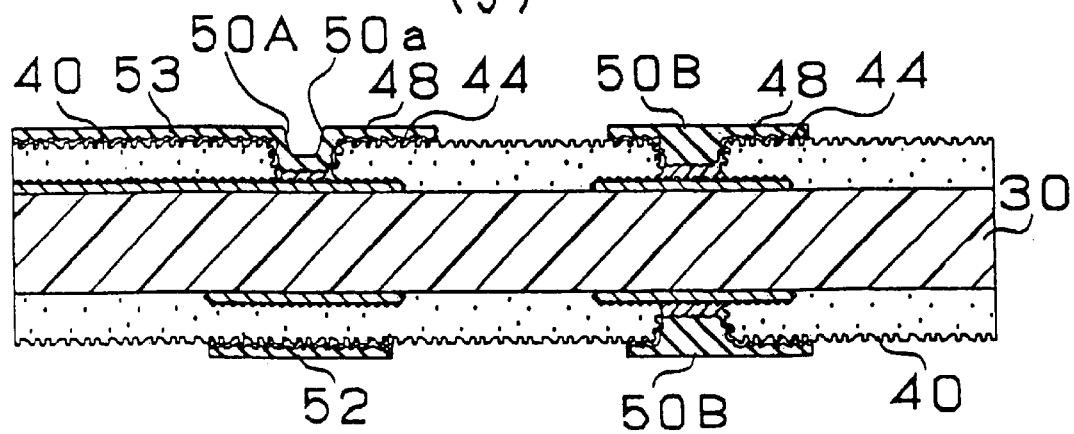
(J)
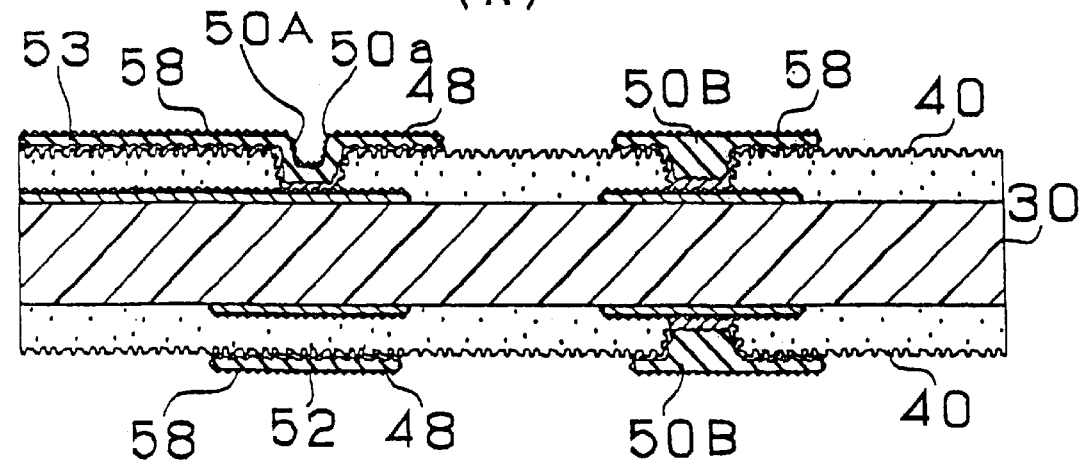
(K)

FIG. 7
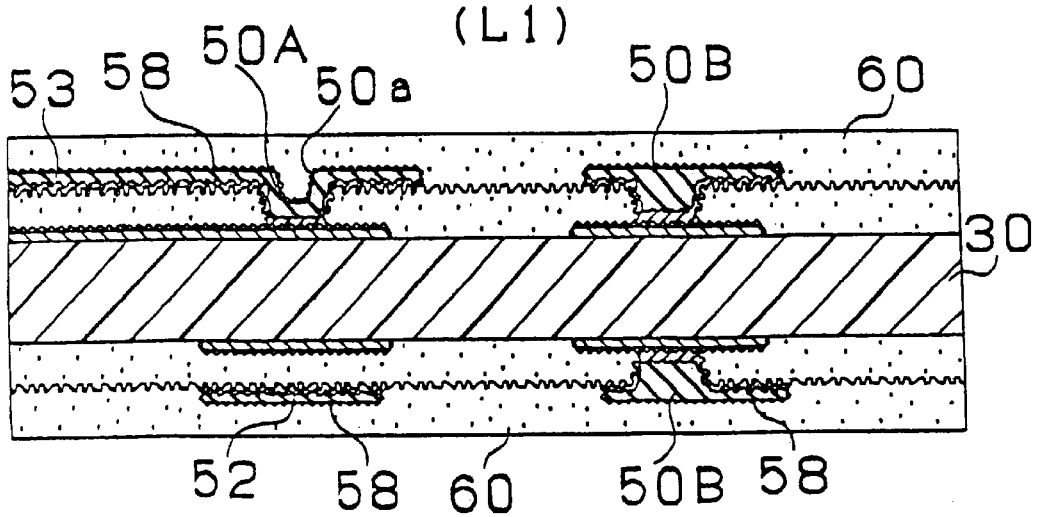
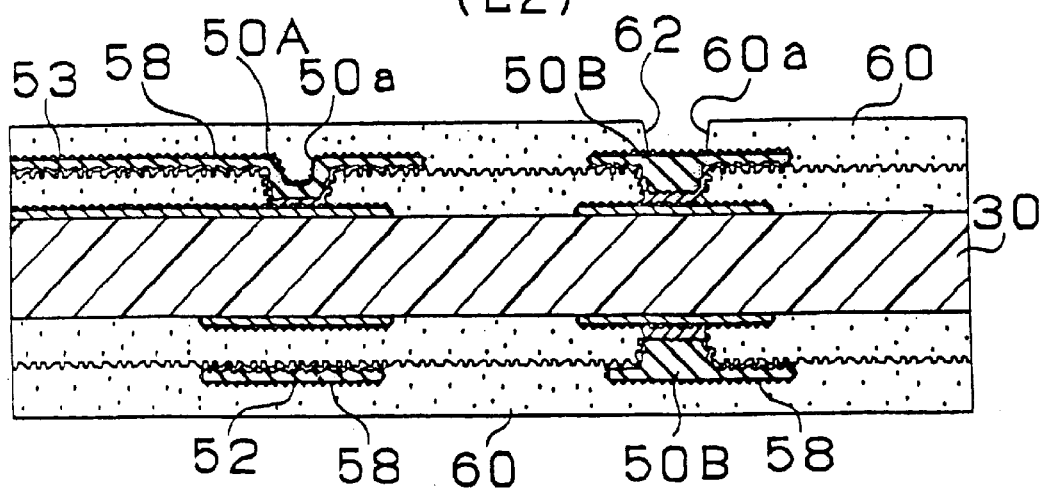
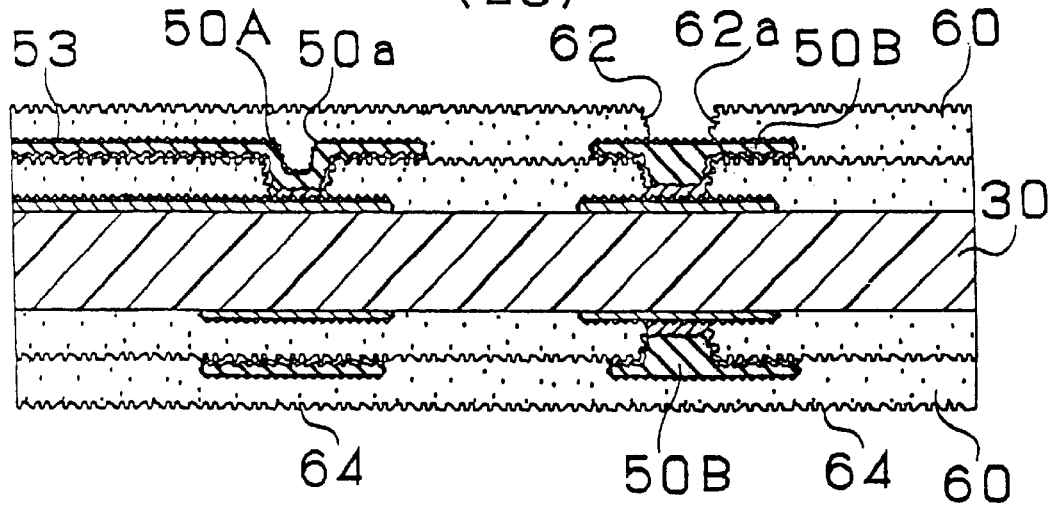

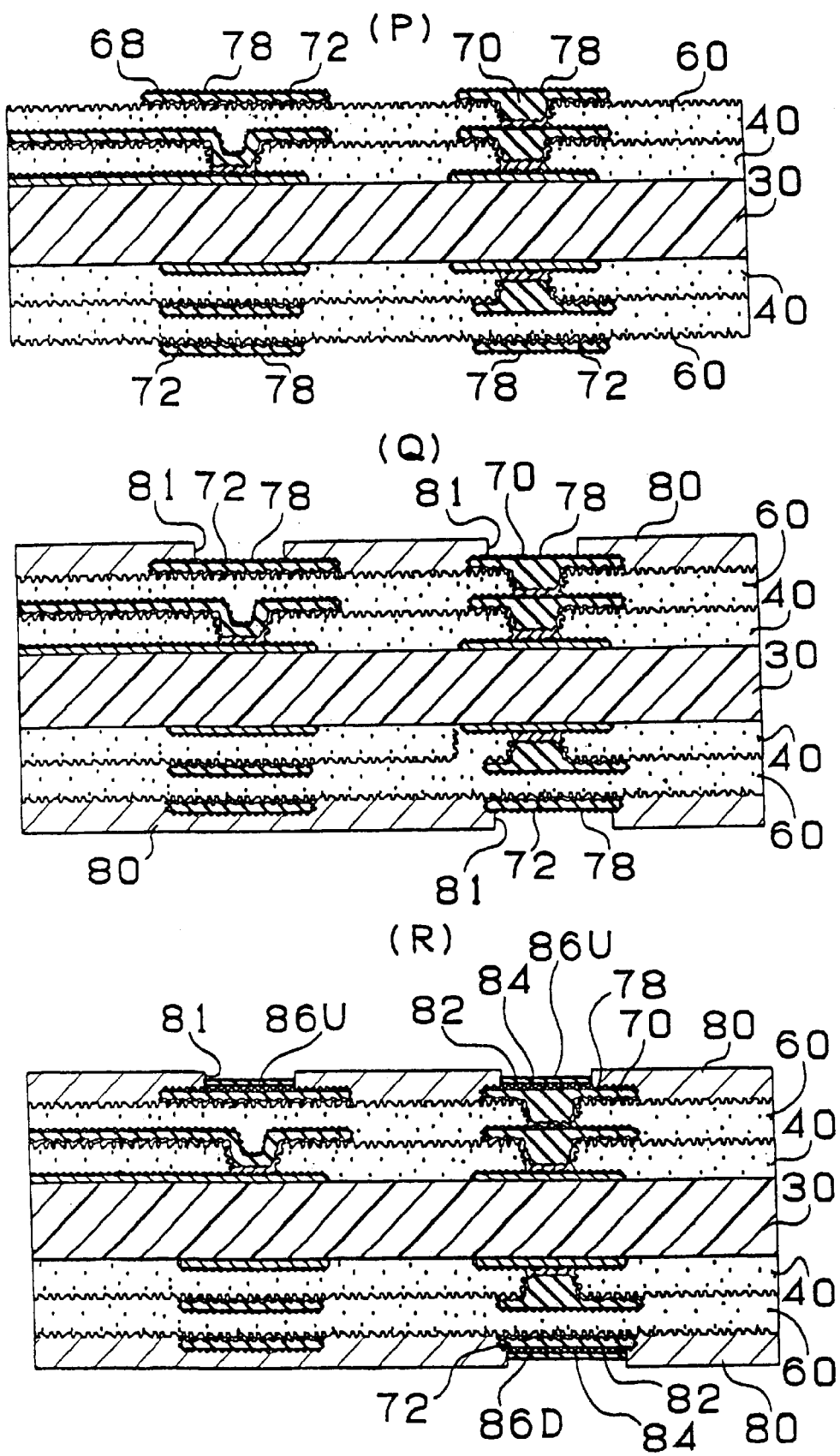

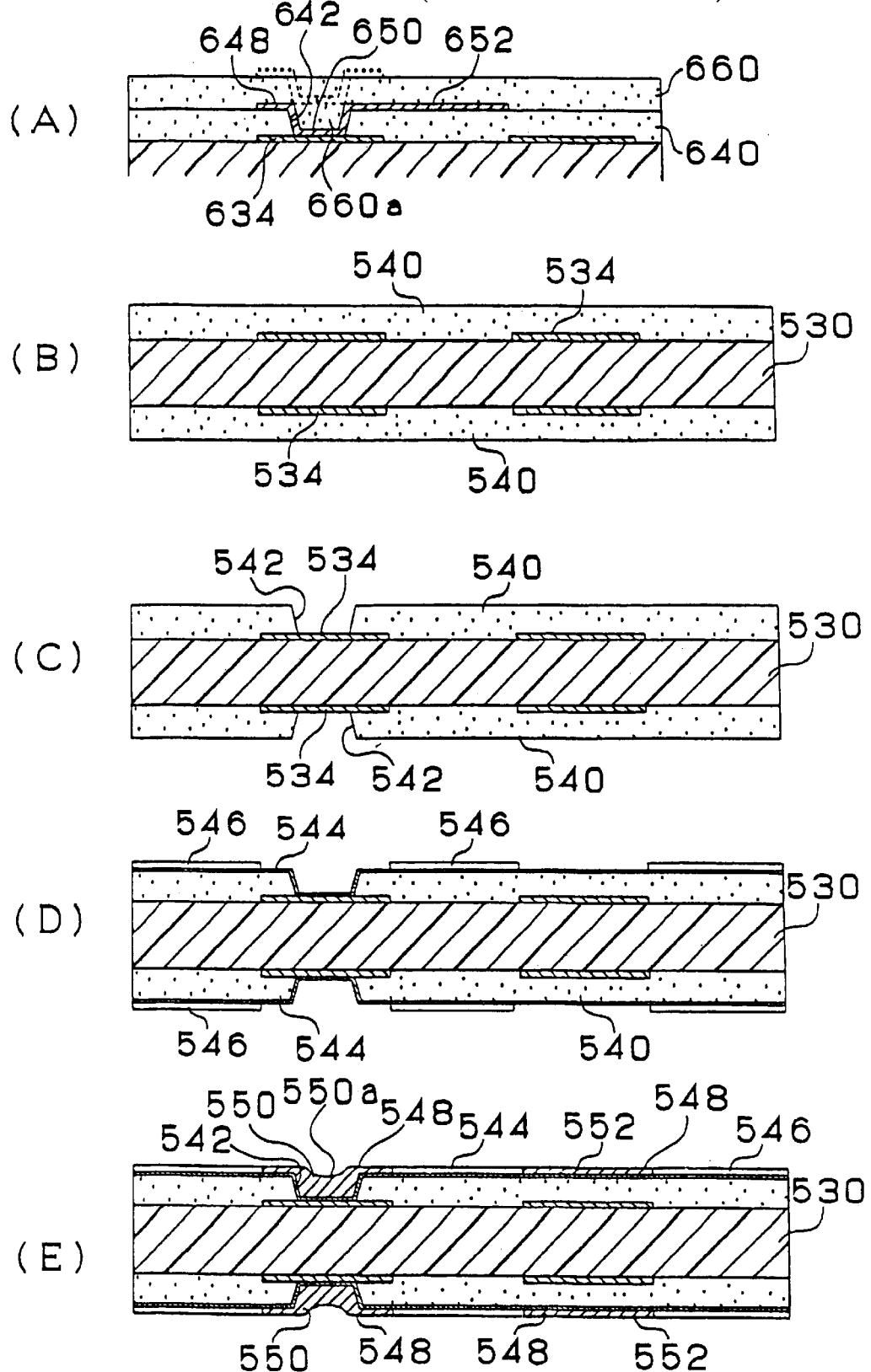

MULTILAYER PRINTED WIRING BOARD

This application is the national phase of international application PCT/JP98/05932 filed Dec. 24, 1998 which designated the U.S.

TECHNICAL FIELD

The present invention relates to a multilayer printed wiring board having a filled-via structure in which an upper via hole is formed directly above a lower via hole.

BACKGROUND ART

The so-called build-up multilayer printed wiring board, shown in FIG. 11(A), consists of a via hole 650 that electrically connects a lower conductor circuit 634 and an upper conductor circuit 652 to each other. The via hole 650 is formed as such that a plated film 648 is created on the inner surface of an opening 642 which is formed in an interlaminer resin insulating layer 640. The inside portion of the plated layer 648 for forming the via hole 650 is filled with resin 660a in order to create an upper interlaminer resin insulating layer 660. Therefore, if a via hole is formed above the via hole 650 as indicated by a dashed line shown in the drawing, the resin 660a enclosed under the plated layer 648 inhibits easy establishment of a connection between the two via holes.

Therefore, when a via hole is formed on a lower via hole, that is, when a via hole is directly connected to another via hole without any interposition of wiring in order to raise the density, a so-called filled-via structure is employed to form the multilayer printed wiring board. As shown in FIG. 11 (I), the filled-via structure is formed such that an opening 542 in the interlaminer resin insulating layer 540 is filled with plated metal 548. The foregoing technique has been disclosed by the applicant of the present invention in Japanese Patent Laid-Open No. 2-188992, Japanese Patent Laid-Open No. 3-3298 and Japanese Patent Laid-Open No. 7-34048.

A method of forming a via hole on another via hole will now be described with reference to FIG. 20(B) to FIG. 11(I).

Initially, the upper and lower surfaces of a substrate 530 having a surface on which a conductor circuit 534 has been formed are coated with resin 540 for creating a lower interlaminer resin insulating layer (see FIG. 11(B)). An opening 542 for forming a via hole is then formed in the resin 540 (see FIG. 11(C)). Subsequently, an electroless-plated film 544 is uniformly deposited on the surface of the substrate 530, and then a resist film 546 is formed (see FIG. 11(D)). This is proceeded by electrolytically-plated film 548 being deposited on a portion in which the resist film 546 is not formed. Thus, a via hole 550 and a conductor circuit 552 are formed (see FIG. 11(E)). The resist film 546 and the electroless-plated film 544 below the resist film 546 are then separated. Subsequently, the surface of the substrate 530 is coated with resin 560 which becomes the upper interlaminer resin insulating layer (see FIG. 11(F)). This is followed by photoetching being performed to make an opening 562 in preparation for an upper via hole in the interlaminer resin insulating layer 560 (see FIG. 11(G)). Then, an electroless-plated film 564 is uniformly deposited on the surface of the substrate 530, and then a resist layer 566 is formed. An electrolytically-plated film 568 is then deposited in the portion in which the resist layer 566 is not formed (see FIG. 11M). Finally, the resist layer 566 and the electroless-plated film 564 below the resist layer are separated so that a via hole 570 and a conductor circuit 572 are formed (see FIG. 11W).

However, the multilayer printed wiring board manufactured by the above-mentioned manufacturing method is subject to unsatisfactory reliability of the connection established between the lower via hole 550 and the upper via hole 570. The inventor of the present invention has researched the cause of this unsatisfactory reliability, resulting in the discovery that a recess 550a is formed in the central portion of the via hole 550 when the electrolytically-plated film 548 is deposited in the opening 542 which is formed in the interlaminer resin insulating layer 540, as shown in FIG. 11(E). That is, as shown in FIG. 11(F), when resin 560, which will be formed into the upper interlaminer resin insulating layer, has been applied to the portion above the via hole 550, the thickness h1 of the resin 560 in the via recess 550a and thickness h2 of the portion except for the recess 550a, are different from each other. Therefore, when the opening 562 for forming the via hole is created in the interlaminer resin insulating layer 560 by photoetching, a small quantity of resin 560a is left in the recess 550a as shown in FIG. 11(G). That is, as shown in FIG. 11(I), the resin 560a insulates the connection. The result of which being that, satisfactory reliability of the connection between the lower via hole 550 and the upper via hole 570 cannot be realized.

In addition to resin 560a in the recess 550a, a further occurrence has been detected that, due to the dint caused by the oxidized film, the reliability of the connection between the lower via hole 550 and the upper via hole 570 is deteriorated. That is, as shown in FIG. 11(E), when the via hole 550 has been formed with the use of electrolytically-plated film 548, an oxidized film is formed on the surface of the lower via hole 550. As shown in FIG. 11(J), the interlaminer resin insulating layer 560, which repeats thermal contraction, imposes stress in a direction to cause the lower via hole 550 and the upper via hole 570 to be separated from each other. If an oxidized film is formed in the interface between the lower via hole 550 and the upper via hole 570, that is, on the surface of the lower via hole 550, the surface of the lower via hole 550 and the lower surface of the upper via hole 570 are separated from each other. As a result, the electric connection between the lower via hole 550 and the upper via hole 570 is broken.

The filled-via multilayer printed wiring board has another problem. Since recesses 550a and 570a are formed in the upper surfaces of the via holes 550 and 570, each having the above-mentioned filled-via structure as shown in FIG. 11(J), the smoothness of the surface of the substrate is deteriorated. Therefore, the mounting reliability that is required when an IC chip or the like is mounted is sometimes deteriorated. To improve the smoothness of the substrate, in order to overcome the above-mentioned problem, the applicant of the present invention has discovered a technique for smoothing the upper surfaces of the via holes. That is, as shown in FIG. 12(D), the upper surfaces of the lower via hole 550 and the upper via hole 570 are flattened so that the substrate is smoothed. FIG. 12(E) is a horizontal cross sectional view taken along line E—E shown in FIG. 12(D), that is, FIG. 12(E) shows a conductor layer formed on the interlaminer resin insulating layer 540. FIG. 12(D) is a vertical cross sectional view taken along line D—D shown in FIG. 12(E).

However, if the upper surface of the via hole is flattened, the upper interlaminer resin insulating layer 560 above the plane layer 553 as shown in FIG. 12(E) is raised as shown in FIG. 12(D). Therefore, in a multilayer printed wiring board having a conductor layer in which a conductor pattern 552 and a plane layer 553 concur, it has been established that the surface of the substrate cannot be flattened.

The reason why the upper layer of the plane layer 553 is raised will now be illustrated with reference to FIGS. 22(A), 22(B), 22(C) and 22(D) showing a process for manufacturing a multilayer printed wiring board. As shown in FIG. 12(A), both the conductor pattern 552, and the plane layer 553, are formed on the upper surface of the lower interlaminer resin insulating layer 540 as described above with reference to FIG. 12(E). To form the upper interlaminer resin insulating layer as shown in FIG. 12(B), the surface of the substrate is coated with resin 560, which will be molded into an interlaminer resin insulating layer with the use of a roll coater or the like. However, the thickness of the upper portion of the plane layer 553 is undesirably enlarged even if the resin 560 is made to have a uniform thickness. The reason for this will now be considered. Resin is introduced between the, conductor pattern 552 and the via hole 550A (see FIG. 12E). Therefore allowing the portion around the conductor pattern 552 and the via hole 550A, which is connected the conductor pattern 552, to be flattened. However, as the resin 560 cannot be relieved from the portion above the plane layer 553, the interlaminer resin insulating layer is undesirably expanded.

Then, as shown in FIG. 12(C), an opening 562 for forming the upper via hole is made in the resin 560. As shown in FIG. 12(D), the opening 542 is then filled with plated metal 568 so that an upper via hole 570 is formed.

However, the multilayer printed wiring board containing the flattened upper surface structured via holes as shown in FIG. 12(D), has a flaw in that the interlaminer resin insulating layer 560 easily separates. The interlaminer resin insulating layer 560 made of resin has excellent adhesiveness with respect to the lower interlaminer resin insulating layer 540 made of resin. However, the interlaminer resin 25 insulating layer 560 has insufficient adhesiveness with respect to the conductor pattern 552, the via hole 550A, and the plane layer 553 made of metal materials. Since the upper interlaminer resin insulating layer 560 is directly in contact with the lower interlaminer resin insulating layer 540 in the section around the conductor pattern 552 and the via hole 550B, strong adhesive contact can be effectuated. In the plane layer 553, the upper interlaminer resin insulating layer 560 cannot be brought into direct contact with the lower interlaminer resin insulating layer 540, resulting in inadequate adhesiveness. Thus, separation of the interlaminer resin insulating layer 560 is precipitated. The multilayer printed wiring board described with reference to FIG. 11(J) is free from the problem of separation. It can be considered that the reason for this lies in the recess in the via hole which is formed in the plane layer. The recess can be said to have an anchoring effect for the interlaminer resin insulating layer.

Solder bumps are created on the surface of a printed wiring board, such as a package substrate, in order to establish an electric connection to an electronic element, such as an IC chip, which will be mounted. Solder bumps are constructed on the conductor circuit on the surface of the substrate. In addition, solder bumps are sometimes created on the via hole in order to, for example, raise the degree of integration. A process for forming solder bumps on a printed wiring board will now be described with reference to FIG. 13.

FIG. 13(A) shows the cross section of a conventional multilayer printed wiring board 510. The multilayer printed wiring board has a structure comprising conductor circuits 534, 552 and 572, which are formed on the upper and lower layers of a core substrate 530 through a plurality of interlaminer resin insulating layers 540 and 560. An opening 562 for the via hole is made in the outermost interlaminer resin insulating layer 560. A via hole 570 is then formed in the opening 562 with copper plating. The via hole 570 establishes the connection to the lower conductor circuit 552 formed below the interlaminer resin insulating layer 560. Resists 580 with openings 581 each having a predetermined diameter, are formed in the outermost interlaminer resin insulating layer 560.

When solder bumps are established on the multilayer printed wiring board 510, a metal mask 598 is placed on the multilayer printed wiring board 510, as shown in FIG. 13(B). Subsequently, solder paste is printed on the surfaces of the openings 581 in the plating resist 580. The metal mask 598 has openings 598a and 598b formed in positions corresponding to the positions of the openings 581 formed in the plating resist 580. The opening 598b corresponding to the via hole 570 has a relatively large diameter, while the opening 598a corresponding to the conductor circuit 572 has a relatively small diameter. As a result, solder paste can be printed on the surface of the via hole 570 in a larger quantity.

After solder paste has been printed, the multilayer printed wiring board 510 is allowed to pass through a heating furnace. Thus, the solder paste is allowed to ref low so that solder bumps 588 are formed, as shown in FIG. 13(C). Thereafter, fluxes that flow from the solder during the reflow process are cleaned. An IC chip 590 is then mounted on the multilayer printed wiring board 510 in such a manner that the IC chip's solder pads 592 correspond to the solder bumps 588 adjacent to the multilayer printed wiring board 510. Subsequently, the multilayer printed wiring board 510 is allowed to pass through a heating furnace so that the solder pads 588 are melted. Thus, the multilayer printed wiring board 510 and the IC chip 590 are electrically connected to each other. At this time, the fluxes allowed to flow from the solder when the reflow process was performed are cleaned.

However, the above-mentioned multilayer printed wiring board has proven to be inadequate in that appropriate connection to an IC chip cannot always be established. That is, the height h3 of the solder bumps 588 formed on the recessed via hole 570, and the height h4 of the solder bumps 588 formed on the flat conductor circuit 572, cannot easily be made to be the same, as shown in FIG. 13(C). Therefore, any one of the solder bumps 588 adjacent to the multilayer printed wiring board 510 cannot appropriately be connected to the solder pads 592 adjacent to the IC chip 5 590, as shown in FIG. 13(D).

Moreover, the metal mask must have openings 598a and 598b having different diameters which are formed at positions corresponding to the positions of the openings 581 formed in the plating resist 580, as described with reference to FIG. 13(B). Therefore, adjustment cannot easily be performed. As described above, solder is allowed to reflow for the purpose of forming the solder bumps, and then the connection between the solder bumps on the multilayer printed wiring board, and the solder pads on the IC chip, is established by performing the reflow process. Finally, the fluxes discharged from the solder must be cleaned. Since the via hole 570 has been filled with solder, the quantity of solder is increased, resulting in the quantity of seepage of fluxes also being increased. Therefore, fluxes are residual even after the cleaning process has been completed, causing short circuit of the wiring to sometimes occur. In addition to the above-mentioned shortcomings, when the reflow process is performed, the multilayer printed wiring board 510 is sometimes warped. In this case, the reliability of mounting of the IC chip 190 sometimes deteriorates.

To counteract the aforementioned imperfections, an object of the present invention is to provide a multilayer printed wiring board having a filled-via structure and exhibiting excellent reliability of the connection between via holes.

Another objective of the present invention, is to provide a multilayer printed wiring board with which the surface of a substrate thereof can be flattened and which is capable of preventing delamination of the interlaminer resin insulating layer.

Another object of the present invention is to provide a multilayer printed wiring board having excellent reliability of the connection with solder bumps.

DISCLOSURE OF THE INVENTION

In order to achieve the aforementioned objectives, the present invention provides a multilayer printed wiring board containing interlaminer resin insulating layers and conductor circuits manufactured as such, that the interlaminer resin insulating layers and the conductor circuits are alternately stacked, wherein an opening is formed in a lower interlaminer resin insulating layer which is filled with a plated metal layer so that a lower via hole having a flat surface is formed. Subsequently allowing for an upper via hole to be formed above a lower via hole.

The present invention is structured in a manner which avoids residual resin. This is made possible by the via hole having a flat surface when the opening for forming the upper via hole is formed within the interlaminer resin insulating layer. Therefore, reliability of the connection between the lower via hole and the upper via hole can be maintained. Since the lower via hole has the flat surface, the smoothness and flatness of the multilayer printed wiring board can be maintained even when an upper via hole is superimposed on the lower via hole.

One of the features of the present invention is that, the surface of the lower via hole is subjected to a coarse process. Therefore, even if an oxidized film is placed on the foregoing surface, the reliability of the connection between the lower via hole and the upper via hole can be maintained.

Another aspect of the present invention is that, the side surface of the opening in the lower interlaminer resin insulating layer is subjected to a coarse process, resulting in improved adhesiveness with the via hole created in the opening.

In conjunction with the above, the present invention submits the surfaces of the upper via hole and the conductor circuit to the coarse process. Therefore, the adhesiveness between the upper via hole, and solder pads on the conductor circuit or an interlaminer resin insulating layer, can be improved.

With respect to the present invention, the lower interlaminer resin insulating layer is made of a composite material of thermoplastic resin and thermosetting resin or mostly comprised of thermoplastic resin which has great tenacity. The durability of this new resin composition prevents the occurrence of cracks in the interlaminer resin insulating layer, even if the opening in the interlaminer resin insulating layer is lined with plated metal for a via hole.

According to another aspect of the present invention, the ratio of the diameter of the via hole and the thickness of the interlaminer resin insulating layer is larger than 1. That is to say, the depth of the opening for the via hole is not too large with respect to the diameter of the opening. Therefore, plating solution can sufficiently be introduced into the opening during the process of forming the via hole with use of a plating process. Moreover, the ratio of the diameter of the via hole and the thickness of the interlaminer resin insulating layer is 4 or lower. That is, the diameter of the opening for the via hole is not too large with respect to the depth of the opening. Therefore, adjustment of the plating duration enables the surface of the via hole to be flattened and smoothed.

In order to achieve the above purpose, the present invention provides a multilayer printed wiring board comprising of interlaminer resin insulating layers and conductor circuits, manufactured as such that the interlaminer resin insulating layers and the conductor circuits are alternately stacked, wherein an opening is formed in a lower interlaminer resin insulating layer. The opening is filled with a plated metal layer so that a lower via hole is formed, and an upper via hole is formed above a coarse layer formed on the surface of the lower via hole.

According to another aspect of the present invention, the lower via hole and the upper via hole are connected through a coarse processed layer formed on the surface of the lower via hole. Therefore, even if an oxidized film is formed on the surface of lower via hole, the reliability of the connection between the lower via hole and the upper via hole can be maintained.

Additionally, the present invention has a recess which is formed in the central portion of the lower via hole. Accordingly, a coarse layer is formed to be perpendicular to the recess, thus allowing the lower via hole and the upper via hole to be firmly connected to each other. The reliability of the connection between the lower via hole and the upper via hole can thus be maintained.

In conjunction with the above, the side surface of the opening of the lower interlaminer resin insulating layer is subjected to a coarse process. Therefore, the adhesiveness with the via hole formed in the opening can be improved.

According to another aspect of the present invention, the surfaces of the upper via hole and the conductor circuit are subjected to the coarse process. Therefore, the adhesiveness between the upper via hole and solder pads, formed on a conductor circuit or an interlaminer resin insulating layer, can be improved.

The present invention has a the lower interlaminer resin insulating layer which is made of a composite material of thermoplastic resin and thermosetting resin or mainly made of thermoplastic resin which has great tenacity. Therefore, even if the opening in the interlaminer resin insulating layer is filled with plated metal for a via hole, a crack does not easily occur in the interlaminer resin insulating layer.

According to another aspect of the present invention, the ratio of the diameter of the via hole and the thickness of the interlaminer resin insulating layer is larger than 1. That is, the depth of the opening for forming the via hole is not too large with respect to the diameter of the opening. Therefore, plating solution can sufficiently be introduced into the opening during the plating process used for forming the via hole. Therefore, the via hole can efficiently be formed by the plating process.

In order to achieve the above purpose, the present invention provides a multilayer printed wiring board having, interlaminer resin insulating layers and conductor layers manufactured as such that the interlaminer resin insulating layers and the conductor circuits are alternately stacked, wherein at least one of the conductor layers has a plane layer comprising of a conductor pattern, which is connected to a the lower via hole. The via hole which is connected to the conductor pattern is filled with a plated metal layer so that the surface of the via hole is flattened, and the via hole formed in the plane layer is filled with a plated metal layer allowing for a recess to be formed in the surface of the via hole formed in the plane layer.

The present invention is structured as such that a recess is provided for the via hole formed within the plane layer. The recess serves as an anchor to improve the adhesiveness between the plane layer and the upper interlaminer resin insulating layer. Therefore, separation of the interlaminer resin insulating layer can be prevented. When resin for forming the interlaminer resin insulating layer above the plane layer is applied in the manufacturing process, the resin is relieved into the recess of the via hole formed in the plane layer. As a result, the surface of the interlaminer resin insulating layer, that is, the surface of the multilayer printed wiring board can be flattened. Thus, the mounting reliability when an IC chip or the like is mounted can be improved. Since the via hole which is connected to the conductor pattern has a flat surface, the smoothness and flatness of the multilayer printed wiring board can be maintained even if the via hole is superimposed on the via hole which is connected to the conductor pattern.

According to another aspect of the present invention, the side surface of the opening of the interlaminer resin insulating layer is subjected to a coarse process. Therefore, the adhesiveness with the via hole formed in the opening can be improved.

Another feature of the present invention pertains to, the surface of the plane layer, including the via hole, being subjected to a coarse process. Therefore, the reliability of the connection between the surface and the upper interlaminer resin insulating layer is not affected.

According to another aspect of the present invention, the depth of the recess provided for the via hole formed in the plane layer is 5 µm or greater. Therefore, a satisfactory anchoring effect can be obtained, allowing the adhesiveness between the plane layer and the upper interlaminer resin insulating layer to be improved. As a result, separation of the interlaminer resin insulating layer can be prevented. When resin for forming the interlaminer resin insulating layer above the plane layer is applied during the manufacturing process, the resin can be relieved into the recess provided for the via hole formed in the plane layer. As a result, the foregoing interlaminer resin insulating layer can be flattened. The depth of the via hole positioned in the plane layer being 50 µm or smaller, allows for the surface of the via hole, which is connected to the conductor pattern to be flattened.

According to another aspect of the present invention, the area of the plane layer is 0.01 dm$^2$ to 10 dm$^2$. Therefore, a recess can be formed on the surface of the plated metal enclosed in the via hole positioned in the plane layer. Moreover, the surface of the plated metal enclosed in the via hole which is connected to the conductor pattern can be flattened.

In order to achieve the above purpose, the present invention provides a multilayer printed wiring board incorporating interlaminer resin insulating layers and conductor circuits manufactured as such that the interlaminer resin insulating layers and the conductor circuits are alternately stacked. The multilayer printed wiring board incorporates, solder bumps formed on a conductor circuit formed on the outermost interlaminer resin insulating layer, and solder bumps formed on a via hole created with the use of an enclosing plated metal layer in an opening formed in the outermost interlaminer resin insulating layer.

In the present invention, a plated metal layer is enclosed in the opening made for the via hole. Thus, the height of the surface of the via hole is made to be the same as the height of the conductor circuit on which solder bumps are formed. Therefore, when solder paste in the same quantities is printed onto the via hole and the conductor circuit, the heights of the solder bumps formed on the via hole and the solder bumps formed on the conductor circuit can be made to be the same, resulting in an improvement in the reliability of the connection of the solder bumps.

According to another aspect of the present invention, a recess is formed in the central portion of the via hole. Therefore, the via hole and the solder bumps can firmly be connected to each other, improving the reliability of the solder bumps.

In addition to the above, the side surface of the opening of the outmost interlaminer resin insulating layer is subjected to a coarse process, allowing the adhesiveness with the via hole formed in the opening 5 to be improved.

According to another aspect of the present invention, the surfaces of the via hole and the conductor circuit are subjected to the coarse process. Therefore, the adhesiveness between the via hole, the conductor circuit, and solder bumps formed thereon, can be improved.

Subsequently, solder bumps are, with noble metal, formed on the surface of the via hole created by enclosing plated metal. Therefore, no oxidized film is formed between the surface of the via hole made of copper or the like and the solder bumps. Thus, the adhesiveness between the via hole and the solder bumps can be improved.

BRIEF DESCRIPTION OF DRAWINGS

FIG. 22(E) is an E—E cross sectional view of FIG. 12(D)

BEST MODE FOR CARRYING OUT THE INVENTION

Figure 1:
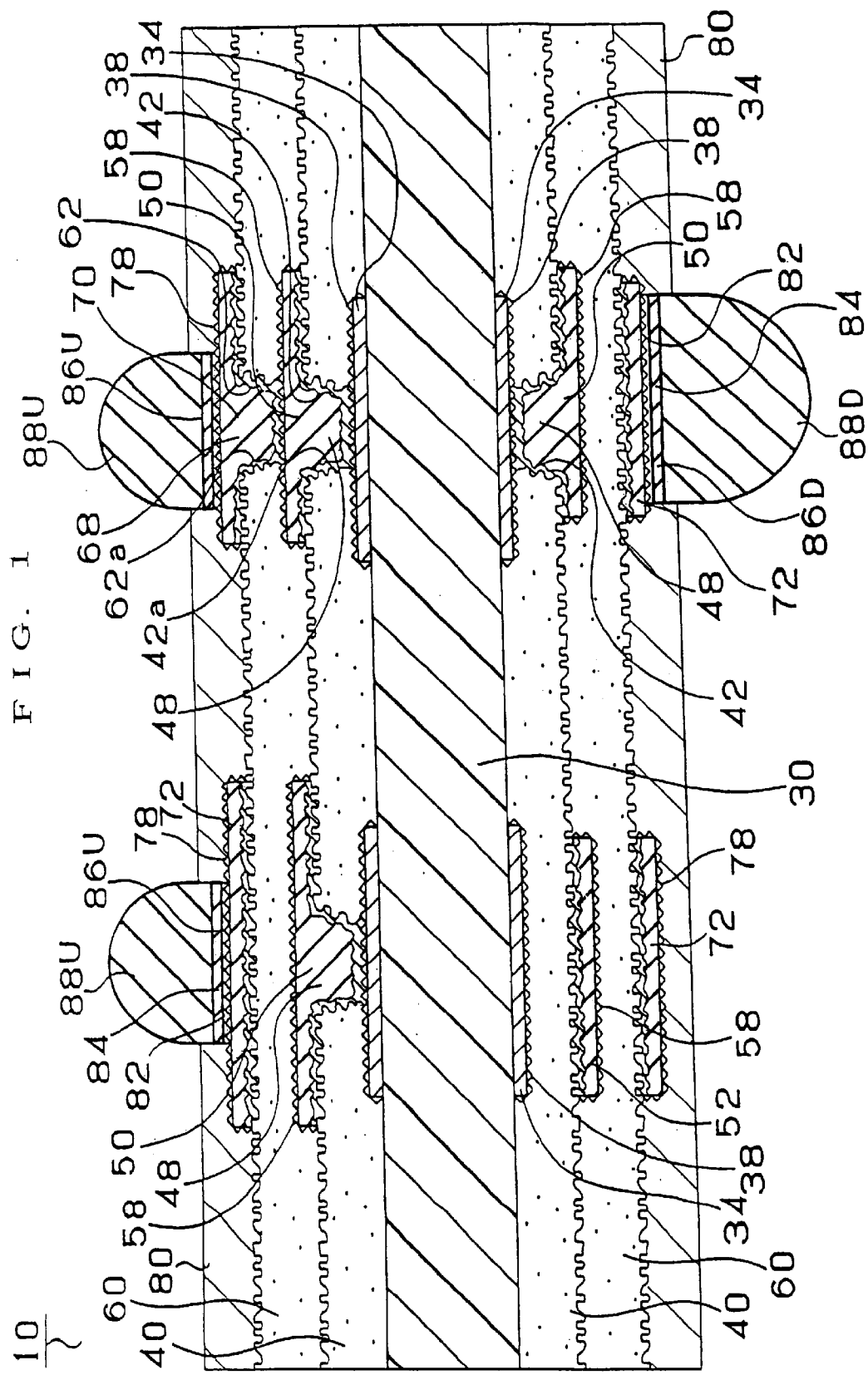
FIG. 1 is a cross sectional view showing a multilayer printed wiring board according to a first embodiment of the present invention.

The structure of a multilayer printed wiring board according to a first embodiment of the present invention will now be described with reference to FIG. 1 which shows the cross section of a multilayer printed wiring board. The multilayer printed wiring board shown in the illustration is provided with solder bumps 88U on its top surface for connecting solder bumps of an IC (not illustrated), and solder bumps 88D on its bottom surface for connecting solder bumps of a mother board (not illustrated). Solder bumps 88U and 88D are used to pass signals between the IC and the motherboard.

On the top and bottom of the upper layer of a core board 30 of a multilayer printed wiring board 10, inner layer copper patterns 34 and 34 are formed. These are used as ground layers (the upper layer mentioned here means a layer formed on the top surface and a layer formed on the bottom surface of the board 30 respectively). In the upper layer of the inner layer copper pattern 34, a conductor circuit 52 is created, for establishing a signal line with the lower interlaminer resin insulating layer 40. In addition, a lower via-hole 50 is formed in the interlaminer resin-insulating layer 40. In the upper layer of the conductor circuit 52 and the lower via-hole 50, an outermost conductor circuit 72 is created with an upper interlaminer resin insulating layer 60 and an upper via-hole 70 in the upper interlaminer resin insulating layer 60.

On the top side of the conductor circuit 72 and the upper via-hole 70, solder pads 86U for supporting solder bumps 88U are formed. Each IC side solder pad 86U is formed so as to be 133 gm in diameter. On the other hand, on-the bottom side of the conductor circuit 72 and the upper via-hole (not shown), solder pads 86D for supporting solder bumps 88D are formed. Each mother board side solder pad 86D is formed so as to be 600 µm in diameter.

In the multilayer printed wiring board 10, the lower via hole 50 has a flat surface. Therefore, the reliability of the connection between the lower via hole 50 and the upper via hole 70 can be maintained. Thus, the smoothness of the surface of the multilayer printed wiring board can be maintained. In the conventional filled-via structure multilayer printed wiring board described with reference to FIG. 11(I), a recess 550a is formed in the lower via hole 550. Therefore, resin 560a, which is an insulating material, is left in the recess 550a. Thus, the reliability of the connection between the lower via hole 550 and the upper via hole 570 deteriorates. On the other hand, the multilayer printed wiring board 10 according to this embodiment has a structure that the lower via hole 50 has a flat surface, as shown in FIG. 1. Therefore, no resin is interposed between the lower via hole 50 and the upper via hole 70. Thus, reliability of the connection can be maintained. In the conventional multilayer printed wiring board shown in FIG. 11(I), a recess 570a that is formed in the upper via hole 570, deteriorates the smoothness of the substrate. Since the surface of the substrate of the multilayer printed wiring board 10 according to this embodiment can be flattened and smoothed, the mounting reliability of an IC chip mounted on the multilayer printed wiring board (a package substrate) can be improved.

Great stress is imposed when thermal contraction takes place because of the difference between the coefficient of thermal expansion of a via hole 50 made of copper, and that of the interlaminer resin insulating layer 40 having the via hole 50 and made of resin. With reference to a conventional via hole 650, illustrated in FIG. 11(A), structured to be filled with resin 660a, stress can be relieved off the resin 660a in the plated copper 648. However, the multilayer printed wiring board 10 according to this embodiment, which has a structure that the openings 42 and 62 of the interlaminer resin insulating layers 40 and 60 are filled with electrolytically plated copper 48 and 68 for the via holes, cannot relieve the stress to the inside portion. Therefore, the multilayer printed wiring board 10 has a structure that allows the lower interlaminer resin insulating layer 40 and the upper interlaminer resin insulating layer 60 to be made of a composite material of thermoplastic resin, which has great tenacity, and thermosetting resin. Thus preventing the occurrence of cracks. Although a combination of thermoplastic resin and thermosetting resin is employed in this embodiment, thermoplastic resin, such as fluororesin, having great tenacity, may be chiefly employed to form the interlaminer resin insulating layers 40 and 60.

As shown in FIG. 1, a coarse layer 58 formed by a coarse process 10 is provided on the surface of the lower via hole 50, that is, the coarse layer 58 is provided for the interface between the lower via hole 50 and the upper via hole 70. Therefore, the two via holes 50 and 70 are firmly joined to each other. As a result, an oxidized film is formed on the surface of the lower via hole 50. Even if stress is imposed in a direction in which the lower via hole 50 and the upper via hole 70 are separated from each other because of thermal contraction of the interlaminer resin insulating layer 60, the reliability of the connection between the lower via hole 50 and the upper via hole 70 will not be affected. Since the side surfaces of 42a and 62a of the openings 42 and 62 of the lower interlaminer resin insulating layer 40 and the upper interlaminer resin insulating layer 60 are subjected to the coarse process as shown in the drawing, the adhesiveness between the via holes 50 and 70 formed in the openings 42 and 62 can be improved. The surfaces of the upper via hole 70 and conductor circuits 72 and 52 are subjected to the coarse process, causing coarse layers 78 and 58 to be formed. Therefore, the adhesiveness with the upper via hole 70 arid solder pads 86U formed ors the conductor circuit 72 can be improved. Moreover, the adhesiveness with the adhesive agent 60 for electroless plating which is formed on the conductor circuit 52 can be improved.

The process for manufacturing the package substrate shown in FIG. 1 will now be described with reference to FIGS. 2 to 6.

Figure 2:
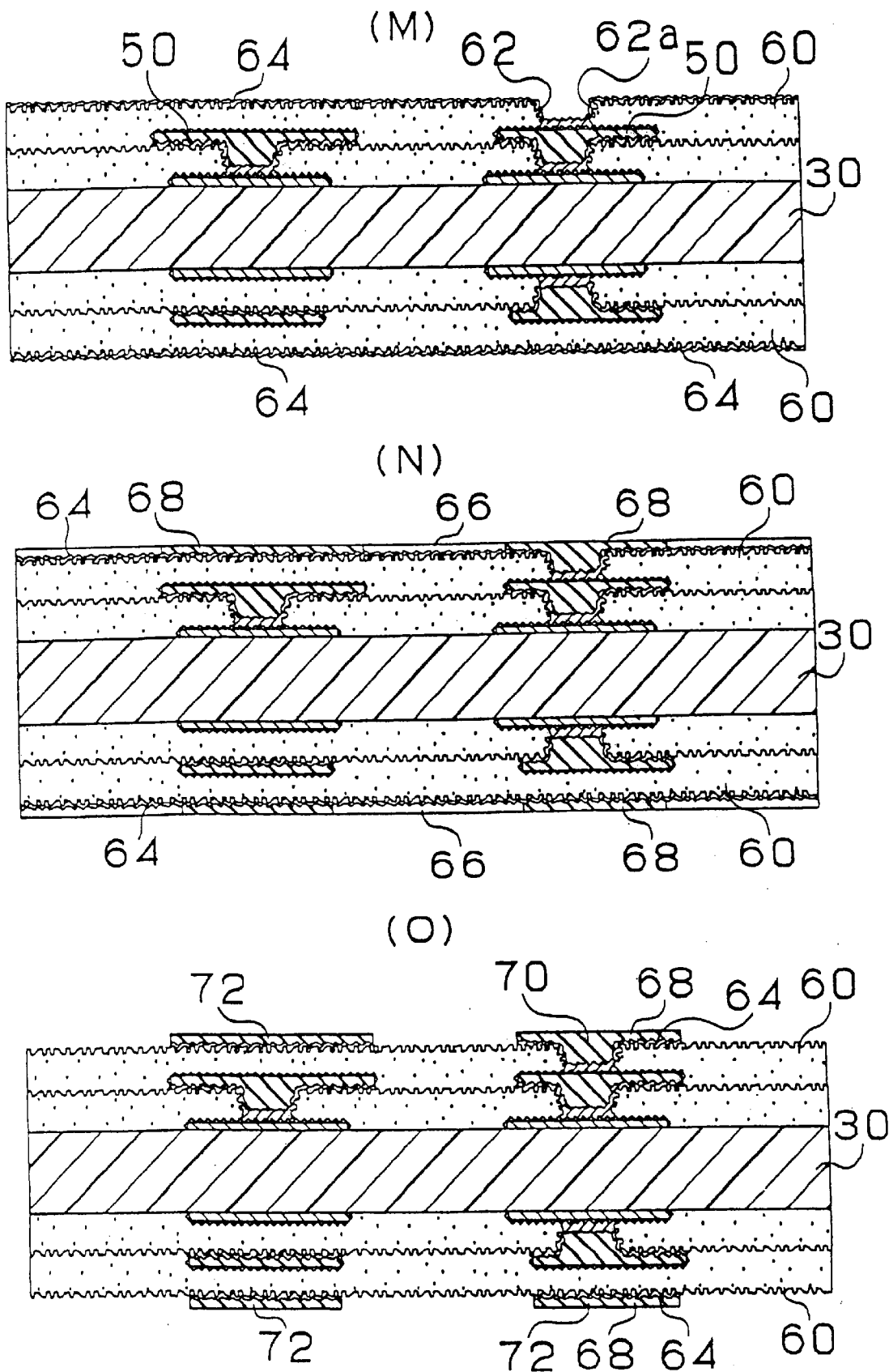
FIGS. 2A to 2R are diagrams showing a process for manufacturing the multilayer printed wing board according to the first embodiment of the present invention.

(1) A copper-clad laminate 30A is obtained first by laminating 18 µm copper foil 32 on both surfaces of a board 30 made of glass epoxy resin or BT (bismaleimide triazine) resin of 1 mm in thickness (process (A) in FIG. 2). After this, the copper-clad laminate 30A is etched for patterning thereby to form inner layer copper patterns 34 on both surfaces of the board 30 (process (B) in FIG. 2).

The substrate 30 having the internal copper pattern 34 formed thereon is cleaned with water, and then the internal copper pattern 34 is dried. Then, the substrate 30 is immersed in electroless plating solution composed of 8 g/l copper sulfate, 0.6 g/l nickel sulfate, 15 g/l citric acid, 29 g/l sodium hypophosphite, 31 g/l boric acid and 0.1 g/l surface active agent and having pH of 9. Thus, a coarse layer 38 having a thickness of 3 μm and composed of copper, nickel and phosphorus is formed on the surface of the internal copper pattern 34 (process (C) in FIG. 2). Then, the substrate 30 is cleaned with water, and then immersed in electroless tin-substitution plating bath composed of 0.1 mol/l tin borofluoride and 1.0 mol/l thiourea solution at 50° C. for one hour. Hence, a tin layer (not shown) having a thickness of 0.3 μm is formed on the coarse layer.

It is possible to level the surface of the substrate by applying resin to the surface of the substrate 30. In this case, after forming the inner layer copper patterns 34, the board 30 is washed in water and dried. Then, the board is treated with oxidation-reduction using NaOH (10 g/l), NaC102 (40 g/l), and Na3P04 (6 g/l) as oxidation bathing (blackening bathing) agents and using NaOH (10 g/l) and NaBH4 (6 g/l) as reduction agents thereby to form a rough layer on the surface of each of the inner layer copper patterns 34.

A Resin Filler is manufactured by use of the following raw Material Compositions.
Resin Composition (1)

This composition (1) is manifested by mixing and stirring 100 weight parts of bisphenol F type epoxy monomer (Yuka Shell, molecular weight 310, YL983U); 170 weight parts of $SiO_2$ ball-like particles (Admatec, CRS1101-CE, the maximum size of particles should be the thickness (15 μm) of the inner layer copper pattern to be described later) 1.6 μm in average diameter, when their surfaces are coated with a silane coupling agent; and 1.5 weight parts of a leveling agent (SANNOPCO, PERENOL S4); then adjusting the viscosity of the mixture to 45,000 to 49,000 cps at 23±1° C.
Hardener Composition (2)

6.5 weight parts of imidazole hardener (Shikoku Chemicals, 2E4MZ-CN)

The resin filler constructed above is coated on both surfaces of the board 30 within 24 hours after manufacture using a roll coating device, thereby to fill a clearance between the conductor circuits (inner layer copper patterns) 34. The filler is then dried at 70° C. for 20 minutes.

Subsequently, one surface of the board 30 is sanded using a belt sanding machine and a #600 belt sand paper (Sankyo Rikagaku) to remove the resin filler 40 completely from the surfaces of both inner layer copper patterns 34. After this, the surface of the board 30 is buffed to remove scratches made by the belt sanding. After this, the resin filler 40 is hardened by baking at 100° C. for one hour, at 120 ° C. for three hours, at 150° C. for one hour, and at 180° C. for seven hours respectively.

After forming the conductor circuits 34, the board 30 is alkaline-degreased for soft-etching, and then is treated with a catalyst solvent consisting of palladium chloride and organic acid thereby to add a Pd catalyst. The catalyst is then activated, and the board 30 is dipped in an electroless plating solvent consisting of $3.2 \times 10^{-2}$ mol/l of copper sulfate, $3.9 \times 10^{-3}$ mol/l of nickel sulfate, $5.4 \times 10^{-2}$ mol/l of a complexing agent, $3.3 \times 10^{-1}$ mol/l of sodium hypophosphite, $5.0 \times 10^{-1}$ mol/l of boracic acid, 0.1 gl of a surface active agent (Nissin Chemical Industry, Surfynol 465), and PH=9. One minute later, the board 30 is vibrated in both vertical and horizontal directions once every 4 seconds thereby to form a needle-like alloy coating layer consisting of Cu—Ni—P and a rough layer on the surfaces of each of the conductor circuits 34.

Furthermore, a Sn layer of 0.3 μm in thickness (not illustrated) is formed on the surface of the rough layer by a Cu—Sn substitution reaction on the conditions of 0.1 mol/l of boracic stannous fluoride, 1.0 mol/l of thiocarbamide, 35° C., and PH=1.2. By the above process, the surface of the substrate may be leveled.

The explanation for manufacturing the package substrate will now continue.

(2) The raw material compositions used to adjust the interlaminer resin insulator following B are stirred and mixed thereby to obtain an interlaminer resin insulator (for lower layers). The viscosity of the layer is then adjusted to 1.5 Pa·s.

The raw material compositions used to manufacture a binding material of electroless plating following A are then stirred and mixed thereby to obtain a binding solution (for the upper layer) for electroless plating. The viscosity of the solution is then adjusted to 7 Pa·s.
A. Raw Material Compositions for Manufacturing a Binding Material for Electroless Plating (Upper Layer Binding Material)
Resin Composition (1)

This resin composition is obtained by mixing and stirring 35 weight parts of a resin solution obtained by dissolving 25% acrylic-modified cresol novolac epoxy resin (Nippon Kayaku, molar weight 2500) into DMDG at a concentration of 80 wt %; 3.15 weight parts of photosensitive monomer (Toagosei, ARONIX M315); 0.5 weight part of an anti-forming agent (SANNOPCO, S-65); and 3.6 weight parts of NMP.
Resin Composition (2)

This resin composition is obtained by mixing 12 weight parts of polyether-sulfone (PES); 7.2 weight parts of epoxy resin particles (Sanyo Chemical Industries, Polymer Pole) 1.0 μm in average diameter; and 3.09 weight parts of the same epoxy resin particles 0.5 μm in average particle diameter then adding 30 weight parts of NMP to the mixture and stirring the mixture using a beads mill.
Hardener Composition (3)

This hardener composition is obtained by mixing and stirring 2 weight parts of an imidazole hardener (Shikoku Chemicals, 2E4MZOCN); 2 weight parts of a photo-initiator (Ciba Geigy, Irgacure I-907); 0.2 of a weight part of a photosensitizer (Nippon Kayaku, DETX-S): and 1.5 weight parts of NMP.
B. Raw Material Compositions for manufacturing the inter-laminer Resin Insulating Material (Lower Layer Binding Material)
Resin Composition (1)

This resin composition (1) is manufactured by mixing and stirring 35 weight parts of a resin solution obtained by dissolving 25% acrylated cresol novolac epoxy resin (Nippon Kayaku, molar weight 2500) into DMDG at a concentration of 80 wt %; 4 weight parts of photosensitive monomer (Toagosei, ARONIX M315); 0.5 of a weight part of an anti-forming agent (SANNOPCO, S-65); and 3.6 weight parts of NMP.
Resin Composition (2)

This resin composition (2) is obtained by mixing 12 weight parts of polyether-sulfone (PES); 14.49 weight parts of epoxy resin particles (Sanyo Chemical Industries, Polymer Pole) 0.5 p in average diameter then adding 30 weight parts of NMP to the mixture and stirring the mixture using a beads mill.
Hardener Composition (3)

This hardener composition (3) is obtained by mixing and stirring 2 weight parts of an imidazole hardener (Shikoku Chemicals, 2E4MZOCN); 2 weight parts of a photo-initiator (Ciba Geigy, Irgacure I-907) 0.2 of a weight part of a photosensitizer (Nippon Kayaku, DETX-S); and 1.5 weight parts of NMP.

(3) Both surfaces of the board are coated with the interlaminer resin insulation material (for lower layers) obtained in (2) of 1.5 Pa·s in viscosity using a roll coating device within 24 hours of manufacture of the solution. Then, the board is left horizontally for 20 minutes, then dried (prebaking) at 60° C. for 30 minutes. After this, the board is coated with a sensitive binding solution 46 (for upper layers) of 7 Pa·s in viscosity obtained in (2) within 24 hours of manufacture of the solution, followed by the board being left horizontally for 20 minutes. Then, the board is dried (prebaking) at 60° C. for 30 minutes thereby to form interlaminer resin insulation layers 40 of 35 $\mu$m in thickness (process (D) in FIG. 2)).

A photo-masking film (not illustrated) provided with appointed diameter printed black circles is stuck fast to each surface of the board on which the interlaminer resin insulation layers 40 are formed respectively, then exposed at 500 mJ/cm$^2$ using a super high voltage mercury lamp. A DMTG solution is then sprayed on the black circles for developing. Furthermore, the board 30 is exposed at 3000 mJ/cm$^2$ using a super high voltage mercury lamp, then heated (postbaking) at 100° C. for one hour and at 150° C. for 5 hours thereby to form an interlaminer resin insulating layer of 20 $\mu$m in thickness. The layer is thus provided with 60 $\mu$m$\Phi$ openings (openings for via-holes 42: bottom 61 $\mu$m, upper 67 $\mu$m), which are excellent in size accuracy, functioning equally to a photo-masking film (process (E) in FIG. 2)). The tinned layer (not illustrated) is partially exposed in each of the openings 42 to be used as via-holes.

(4) The board 30 containing openings 42 is then dipped in chromic acid for 2 minutes thereby to melt and remove epoxy resin from the surface of the interlaminer resin insulation layer 40 and make a rough surface (roughened depth 4 $\mu$m). The rough surface is also made on the side surfaces 42a of the openings 42 (process (F) in FIG. 2) ). After this, the board 30 is dipped in a neutralized solution (SHIPLEY), then washed with water.

A palladium catalyst (Atotech) is thus applied to the roughened surface of the board 30 to stick catalytic nuclei on the surface of the interlaminer resin insulating layer 40, as well as the inner wall surfaces of each of the via-hole openings 42.

(5) The board is then dipped in an electroless copper plating water solution consisting of the following compositions thereby to form an electroless copper plating film 44 of 0.6 $\mu$m in thickness on the whole rough surface (process (G) in FIG. 2).

Electroless Plating Water Solution

EDTA . . . 150 g/l

Copper sulfate . . . 20 g/l

HCHO . . . 30 ml/l

NaOH . . . 40 g/l

α, α'-bipyridyl . . . 80 mg/l

PEG . . . 0.1 g/l (6) A market-sold photosensitive dry film is stuck on the electroless copper plating film 44 formed in (5), then a mask is put on the film for exposing at 100 mJ/cm$^2$ and for developing using 0.8% sodium thereby to form a plating resist 46 of 20 H,m in thickness, L/S=25/25 $\mu$m (process (H) in FIG. 2).

(7) Subsequently, electrolytic copper plating is applied to the portion in which the resist is not formed so that an electrolytically-plated copper film 48 having a thickness of 20 $\mu$m is deposited. Thus, the opening 42 is filled with plated film (process (I) shown in FIG. 2).

Conditions of Solution copper sulfate. Penta-hydrate: 60 g/l sulfuric acid: 190 g/l chorine ions: 40 ppm leveling material (HL manufactured by ATTECH): 40 ml/l brightener (UV manufactured by ATTECH): 0.5 ml/l Operation Conditions bubbling: 3.00 l/minutes density of electric current: 0.5 A/dm$^2$ set electric current: 0.18 A duration of plating process: 130 minutes (8) The plating resist 46 is separated and removed with 5%KOH, then 20 the electroless plated film 44 under the plating resist 46 is melted and removed with etching treatment using a mixed solution of sulfuric acid and hydrogen peroxide thereby to form conductor circuits 52 of 18 $\mu$m in thickness respectively, as well as via-holes 50 consisting of an electroless copper plated film 44 and an electrolytic copper plated film 48 respectively (process (J) in FIG. 2).

As compared with the conventional electrolytic copper plating, the manufacturing method according to the first embodiment is structured as such that the quantity of the leveling material for smoothing and flattening the plated surface is increased; the quantity of brightener for making the plated surface bright is reduced the set electric current is reduced and the duration for which plating is performed is elongated. That is, the electrolytic plating is performed with a small electric current for a long time so that the surface of the via hole 50 is smoothened and flattened.

In this embodiment, the ratio of the diameter of the via hole (diameter of the opening 42: 67 $\mu$m) and the thickness (20 $\mu$m) of the interlaminer resin insulating layer 40 is set to be 3.35. If the ratio of the diameter of the via hole and the thickness of the interlaminer resin insulating layer is 1 or lower, the depth with respect to the diameter of the opening 42 is too large to permit the plating solution to sufficiently be introduced into the opening 42 during the foregoing plating process. In this case, the plating process cannot efficiently be performed. If the ratio of the diameter of the via hole and the thickness of the interlaminer resin insulating layer is larger than 4, the diameter of the opening for forming the via hole is too large with respect to the depth. Therefore, if the plating duration is not elongated considerably, a recess is formed in the central portion. In this case, the surface of the via hole cannot be smoothened and flattened. Therefore, it is preferable that the ratio of the diameter of the via hole and the thickness of the interlaminer resin insulating layer is larger than 1 and not larger than 4.

It is preferable that the thickness of the conductor circuit 52 is 40 $\mu$m or smaller, ideally 20 $\mu$m or smaller. The reason for this will now be illustrated. The thickness of the conductor circuit 52 is determined by the thickness of the plating resist 46. If the thickness of the plating resist is larger than 40 $\mu$m, the resolution deteriorates excessively to deform from the required shape.

(9) Then, a coarse layer 58 is manifested on the conductor circuit 52 and the via-hole 50 of the package substrate 30 using the aforementioned process (2) (process (K) in FIG. 2).

(10) Steps (2) to (8) are repeated so that a further upper conductor circuit is formed. In other words, both surfaces of the board 30 are coated with Binding Material for Electroless Plating and left horizontally, then dried. After this, a photo-masking film is attached securely to both surfaces of the board 30, then exposed and developed to form the thickness (20 μm) of the interlaminer resin insulating layer 60 provided with openings (via-holes 62) (process (L) in FIG. 2). The surface of the interlaminer resin insulating layer 60 is then roughened. After this, an electroless copper plated film 64 is formed on the roughened surface of the board 30 (process (M) in FIG. 2). It is followed by the forming of a plating resist 66 on the electroless copper plated film 64, then by forming of an electrolytic copper plated film 68 on the no-resist-coated portion of the film 66 (process (N) in FIG. 2). The plating resist 66 is removed and the electroless plated film 64 under the plating resist 66 is melted and removed thereby to form conductor circuits 72 as well as upper via-holes 70 (process (O) in FIG. 2). Then, a roughened layer 78 is formed on the surfaces of the conductor circuits 72 and the upper via-holes 70, then wiring board is completed (process (P) in FIG. 2).

(11) Thereafter, solder bumps are formed on the above-mentioned package substrate. Solder Resist Composition will now be explained.

Solder resist composition is obtained by mixing 46.678 of photosensitive oligomer (molecular weight 4000) obtained by acrylic-modifying 50% of epoxy groups of 60 percentage by weight of cresol novolac dissolved into DMDG of 50% epoxy resin (Nippon Kayaku); 15.0 g of 80 percentage by weight of bisphenol A type epoxy resin (Yuka Shell, Epikote 1001) dissolved into methyl ethyl ketone; 1.6 g of imidazole hardener (Shikoku Chemicals, 2E4MZ-CN); 3 g of multi-valent acrylic monomer (Nippon Kayaku, R604) which is photoreceptive monomer 1.5 g of the same multivalent acrylic monomer (KYOEISHA CHEMICAL, DPE6A); 0.71 g of a scattering anti-foaming agent (SANNOPCO, S-65); then adding 2 g of benzophenone (KANTO CHEMICAL) used as a photo-initiator and 0.2 g of Michler's ketone (KANTO CHEMICAL) used as a photosensitizer to the mixture and adjusting the viscosity to 2.0Pa·s at 25° C.

(12) Both surfaces of the board 30 manufactured in (10) are coated 10 with the above solder resist composition at a thickness of 45 μm. The board 30 is then dried at 70° C. for 20 minutes, then at 70° C. for 30 minutes. After this, a photo-masking film (not illustrated) of 5 mm in thickness on which circles (masking pattern) are drawn, is stuck fast to both surfaces of the board 30 respectively, then exposed to an ultraviolet beam of 1000 mJ/cm$^2$ and developed with DMTG. In addition, the board 30 is baked at 80° C. for 1 hour, at 100° C. for 1 hour, at 120° C. for 1 hour, and at 150° C. for 3 hours thereby to form a solder resist layer (20 μm thick) 80 provided with an opening 81 for each solder pad (including the via-hole and its land) (process (Q) in FIG. 2). The diameter of the opening of the topside pad (opening) 81 is made to be 133 μm, and the bottom side pad 81 is made to be 600 μm,

(13) Thereafter, the substrate 30 is dipped in an electroless nickel plating solution of pH=4.5 for 20 minutes to form a nickel plated layer 82 of 5 μm in thickness in the opening 81. The electroless nickel plating solution consists of $2.31\times10^{-1}$ mol/l of nickel chloride, $2.8\times10^{-1}$ mol/l of sodium hypophosphite, and $1.85\times10^{-1}$ mol/l of sodium citrate. The board 30 is then dipped in an electroless gold plating solution for 7 minutes 20 seconds at 80° C. to form a gold plated layer 84 of 0.03 μm in thickness on the nickel plated layer 81, so that solder pads 86U (133 μm diameter) are formed on the top side, and solder pads 86D (600 μm diameter) are formed on the bottom side (process (R) in FIG. 2). The electroless gold plating solution consists of $4.1\times10^{-2}$ mol/l of gold potassium cyanide, $1.87\times10^{-1}$ mol/l of ammonium chloride, $1.16\times10^{-1}$ mol/l of sodium citrate, and $1.7\times10^{-1}$ mol/l of sodium hypophosphite.

(14) A metal mask (40 μm thick: not illustrated) having apertures (160 μm diameter) is set on the board, and solder paste (20 μm in average diameter of particle) is printed on the upper side solder pads 86U in the openings 81 of the solder resist layer 80 as well as on the lower side solder pads 86D in the openings 81 of the solder resist layer 80. At that time, solder paste is reflowed at 200° C. thereby forming solder bumps (solder bodies) 88U (133 μm diameter) on top of the upper side solder pads 86U and simultaneously forming solder bumps (solder bodies) 88D (600 μm diameter) on top of the bottom side solder pads 86D. This completes the solder bump manufacturing process (see FIG. 1).

As described above, the multilayer printed wiring board according to the first embodiment makes it possible for the via holes to be directly connected to each other without any wiring. Therefore, raising the density. When the lower via hole and the upper via hole are connected to each other, the reliability of the connection between the upper and lower via holes can be maintained because the lower via hole has a flat surface and no resin is left on the surface of the via hole to inhibit connection. Since the lower via hole has a flat surface, the smoothness and flatness of the multilayer printed wiring board can be maintained even if an upper via hole is superimposed.

The structure of a multilayer printed wiring board according to the second embodiment of the present invention will now be described with reference to FIG. 3 which is a cross sectional view showing a multilayer printed wiring board. The multilayer printed wiring board 200 shown in the illustration is composed as a package board.

Inner layer copper patterns 34 and 34, which are used as ground layers, are formed on the top and bottom upper layers of the core board 30 of the multilayer printed wiring board 200. In the upper layer of the inner layer copper pattern 34, a conductor circuit 52, for establishing a signal line with the lower interlaminer resin insulating layer 40 therebetween, is formed. In addition, a lower via-hole 50 is formed through the interlaminer resin insulating layer 40. In the upper layer of the conductor circuit 52 and the lower via-hole 50, an outermost conductor circuit 72 is created. This circuit contains an upper interlaminer resin insulating layer 60 and an upper via-hole 70 in the upper interlaminer resin insulating layer 60.

On the top side of the conductor circuit 72 and the upper via-hole 70, solder pads 86U, for supporting solder bumps 88U, are formed. Each IC side solder pad 86U is formed so as to be 133 gm in diameter. On the bottom side of the conductor circuit 72 and the upper via-hole (not depicted), solder pads 86D for supporting solder bumps 88D are formed. Each mother board side solder pad 86D is formed so as to be 600 gm in diameter.

The multilayer printed wiring board according to the second embodiment has a structure that contains a coarse layer 58, formed by a coarse process, which is placed on the surface of the lower via hole 50. That is, the coarse layer 58 is provided for the interface between the lower via hole 50 and the upper via hole 70. Therefore, the two via holes 50 and 70 can firmly be joined to each other. An oxidized film is consequently formed on the surface of the lower via hole 50. Even if stress is imposed in a direction in which the lower via hole 50 and the upper via hole 70 are separated from each other by dint of thermal contraction of the interlaminer resin insulating layer 60, the reliability of the connection between the lower via hole 50 and the upper via hole 70 can be maintained. Moreover, a recess 50a is formed in the central portion of the lower via hole 50. In addition, a coarse layer 58 is formed to be perpendicular to the curved surface of the recess 50a. Therefore, the lower via hole 50 and the upper via hole 70 can firmly be connected to each other even if stress is imposed in a vertical direction as illustrated in the drawing in which the lower via hole 50 and the upper via hole 70 are separated from each other. As a result, the connection between the lower via hole 50 and the upper via hole 70 can be maintained. The side surfaces 42a and 62a of the openings 42 and 62 of the lower interlaminer resin insulating layer 40 and the upper interlaminer resin insulating layer 60 are subjected to the coarse processes as shown in the drawing. Therefore, the adhesiveness with the via holes 50 and 70 which are formed in the openings 42 and 62 can be improved. The depth of the recess 50a may be arranged so that the recess does not reach, the opening 62 of the upper interlaminer resin insulating layer 60 and within the thickness of the conductor circuit 72. Therefore, the depth is within 0.5~30 μm.

Great stress is imposed between the lower via hole 50, made of copper, and the interlaminer resin insulating layer 40, in which the lower via hole 50 has been formed and which is made of resin. This stress is due to the difference in the coefficient of thermal expansion between the via hole 50 and the interlaminer resin insulating layer 40. The conventional via hole 650 described with reference to FIG. 11(A) and having a structure that the inside portion is filled with resin 660a is able to relieve the stress to the resin 660a in the plated copper 648. However, the multilayer printed wiring board 200 according to this embodiment has the structure that the openings 42 and 62 of the interlaminer resin insulating layers 40 and 60 are filled with the electrolytically-plated copper 48 and 68 for the via holes. Therefore, the stress cannot be relieved to the inside portion. Hence, the multilayer printed wiring board 200 has a structure that both the lower interlaminer resin insulating layer 40, and the upper interlaminer resin layer 60, are made of a composite material of thermoplastic resin, having great tenacity, and thermosetting resin. Consequently, occurrence of cracks can be prevented. Although a composite material of thermoplastic resin and thermosetting resin is employed in this embodiment, thermoplastic resin, such as fluororesin, having great tenacity may mainly be chiefly employed to form the interlaminer resin insulating layers 40 and 60.

Moreover, the surfaces of the upper via hole 70 and the conductor circuits 72 and 52 are subjected to the coarse process forming coarse layers 78 and 58. The result being that, the adhesiveness with the upper via hole 70 and the solder pads 86U formed on the conductor circuit 72, and that with the adhesive agent 60 for electroless plating formed on the conductor circuit 52, can be improved.

Figure 8:
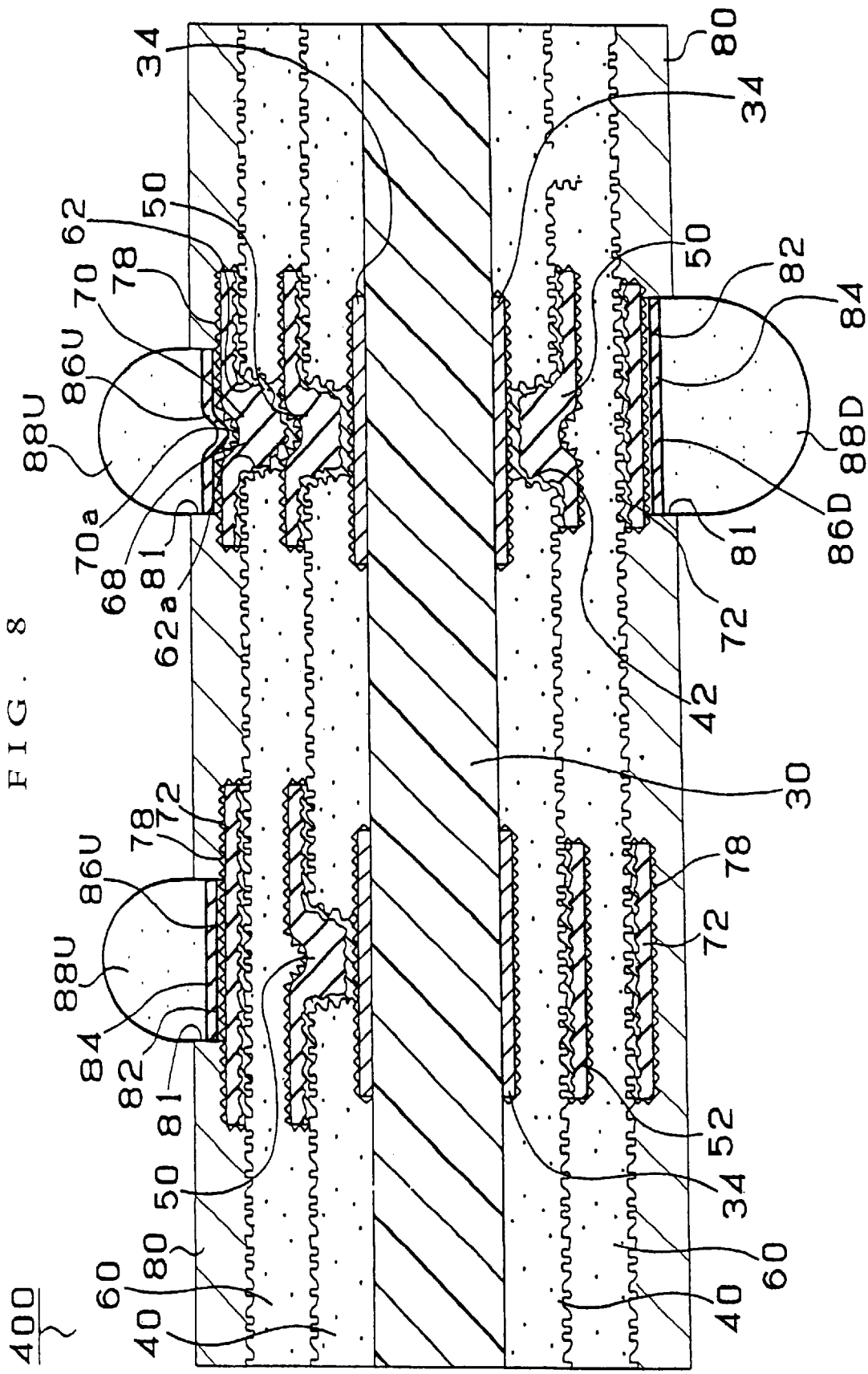
FIG. 8 is a cross sectional view showing a multilayer printed wiring board according to a fourth embodiment of the present invention.
Figure 9:
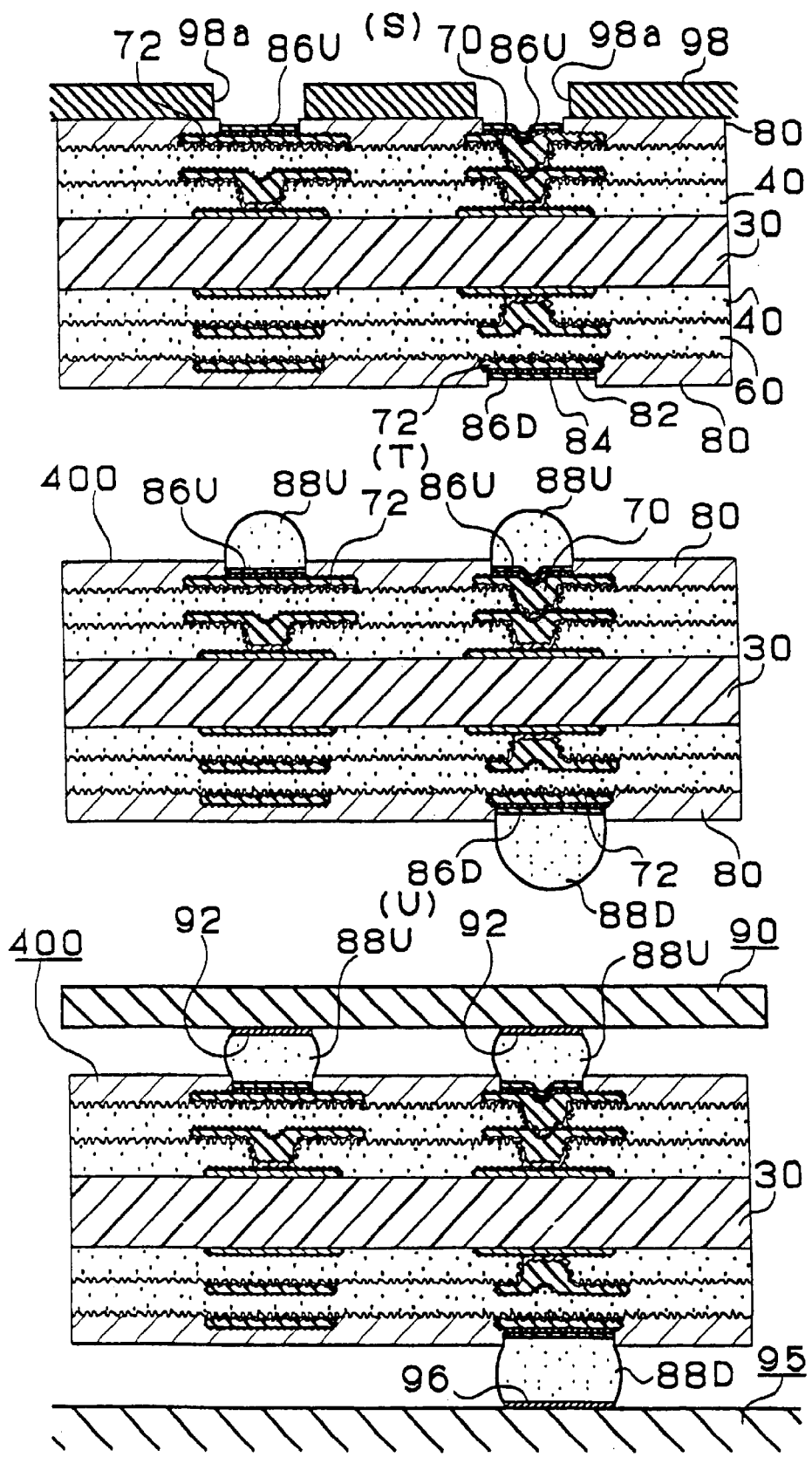
FIGS. 9S to 9U are diagrams showing a process for manufacturing a multilayer printed wiring board according to the fourth embodiment of the present invention.

The process for manufacturing the multilayer printed wiring board shown in FIG. 3 will now be described with reference to FIGS. 8 to 10. Since steps (1) to (6) for manufacturing the multilayer printed wiring board according to the second embodiment are similar to those according to the first embodiment described with reference to FIGS. 2 and 3, the same steps are omitted from description.

(7) The portion near the substrate 30 in which a plating resist has been 46 formed in step (H) shown in FIG. 2, where there is no resist, is subjected to electrolytic copper plating under the following conditions so that a coarse layer 58 having a thickness of 20 μm can be deposited. The inside portion of the opening 42 is filled with the plated film (process (I) in FIG. 4).
Conditions of Solution
   coppersulfate penta-hydrate: 60 g/l
   sulfuric acid: 190 g/l
   chorine ions: 40 ppm
   leveling material (HL manufactured by ATTECH): 40 ml/l
   brightener (UV manufactured by ATTECH): 0.5 ml/l
Operation Conditions
   bubbling: 3.00 l/minutes
   density of electric current: 0.5 A/dm$^2$
   set electric current: 0.18 A
   duration of plating process: 100 minutes The manufacturing method according to this embodiment is structured as such that the electrolytic plating process is performed in such a manner that a recess 50a is formed in the central portion of the electrolytic copper plated film 48 used for forming the via hole 50.

(8) The plating resist 46 is separated and removed by using 5% KOH solution, and then the electroless-plated copper film 44 under the plating resist 46 is dissolved and removed by performing an etching process which uses a mixed solution of sulfuric acid and hydrogen peroxide. Thus, a conductor circuit 52 composed of electroless-plated copper film 44 and electrolytic copper plated film 48 and having a thickness of about 15 μm, and the via hole 50 are formed (process (J) in FIG. 4).

In this embodiment, the ratio of the diameter of the via hole (diameter of the opening 42: 67 μm) and the thickness (20 μm) of the interlaminer resin insulating layer 40 is set to be 3.35. If the ratio of the diameter of the via hole and the thickness of the interlaminer resin insulating layer is 1 or lower, the depth with respect to the diameter of the opening 42 is too large to permit plating solution to be sufficiently introduced into the opening 42 in the foregoing plating process. In this case, the plating process cannot efficiently be performed. If the ratio of the diameter of the via hole and the thickness of the interlaminer resin insulating layer is larger than 4, the diameter of the opening for forming the via hole is too large with respect to the depth. Therefore, it is preferable that the ratio of the diameter of the via hole and the thickness of the interlaminer resin insulating layer be larger than 1 and not larger than 4.

It is preferable that the thickness of t he conductor circuit 52 be 40 μm or smaller, ideally 20 μm or smaller. The reason for this will now be described. The thickness of the conductor circuit 52 is determined by the thickness of the plating resist 46. If the thickness of the plating resist is larger than 40 μm, the resolution deteriorates excessively to deform from the required shape.

Figure 4:
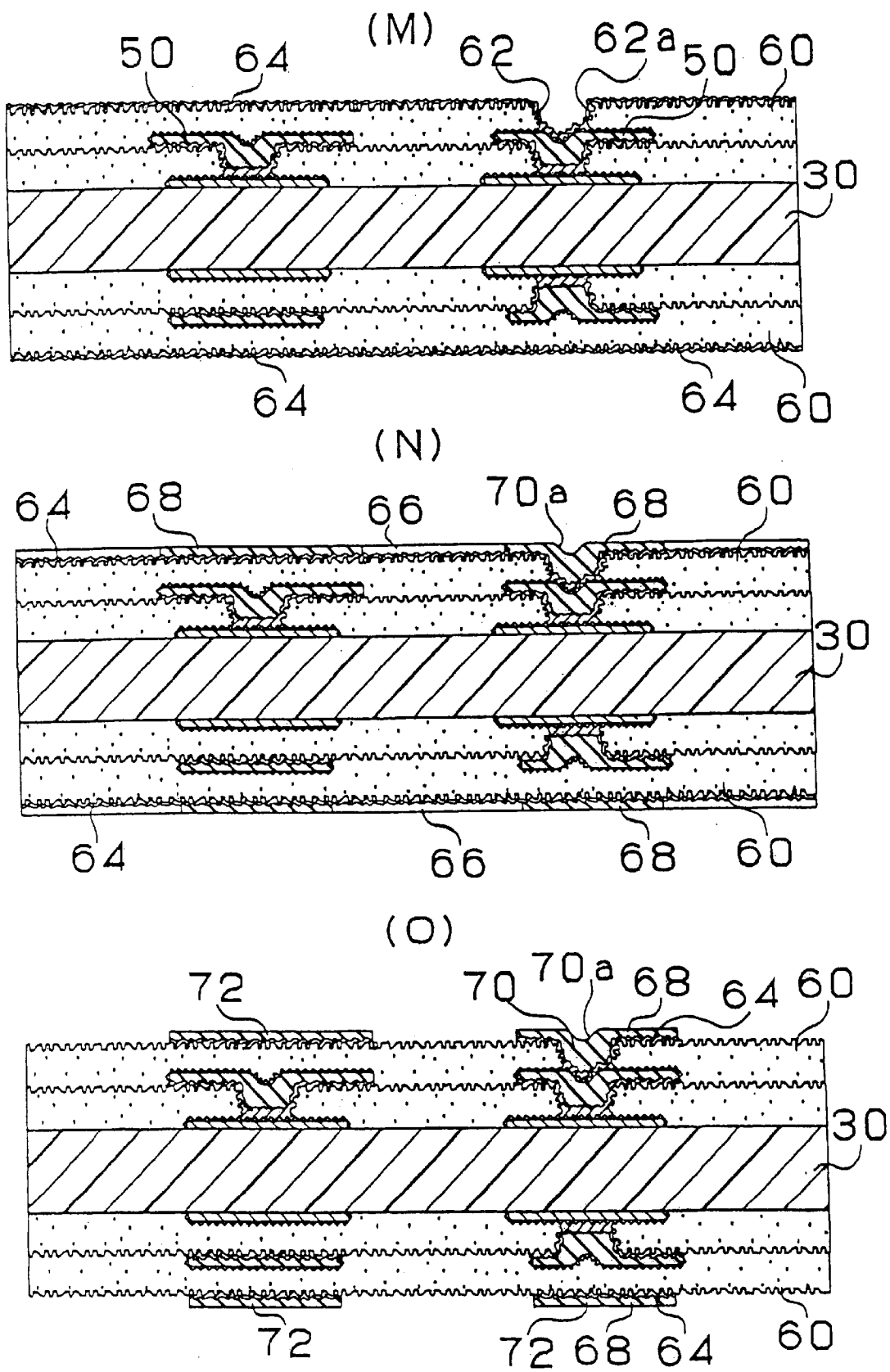
FIGS. 4I to 4R are diagrams showing a process for manufacturing the multilayer printed wiring board according to the second embodiment of the present invention.

(9) The coarse layer 58 is provided for the conductor circuit 52 of the substrate 30 and the lower via hole 50 similarly to step (2) above process (K) in FIG. 4). The coarse layer 58 is formed to be perpendicular to the curved surface of the recess 50a existing in the central portion of the via hole 50.

(10) Steps (2) to (8) above are repeated so that a further upper conductor circuit is formed. Both surfaces of the board 30 are coated with Binding Material for Electroless Plating and left horizontally , then dried. This is followed by a photo-masking film being securely attached to both surfaces of the board 30, then exposed and developed to form a thickness (20 μm) of the interlaminer resin insulating layer 60 provided with openings (via-holes 62) (process (L) in FIG. 4). The surface of the interlaminer resin insulating layer 60 is then roughened. After this, an electroless copper plated film 64 is placed on the roughened surface of the board 30 (process (M) in FIG. 4). It is followed by the forming of a plating resist 66 on the electroless copper plated film 64, then by the forming of an electrolytic copper plated film 68 on the no-resist-coated portion of the film 66 (process (N) in FIG. 4). The plating resist 66 is removed and the electroless plated film 64 under the plating resist 66 is melted and removed thereby to form conductor circuits 72 as well as upper via-holes 70 (process (O) in FIG. 4). Then, a roughened layer 78 is formed on the surfaces of the conductor circuits 72 and the upper via-holes 70, then the wiring board is completed (process (P) in FIG. 4).

(11) Solder bumps are then formed on the abovementioned package substrate as per the same process as in the first embodiment (process (Q), (R) in FIG. 4).

Figure 3:
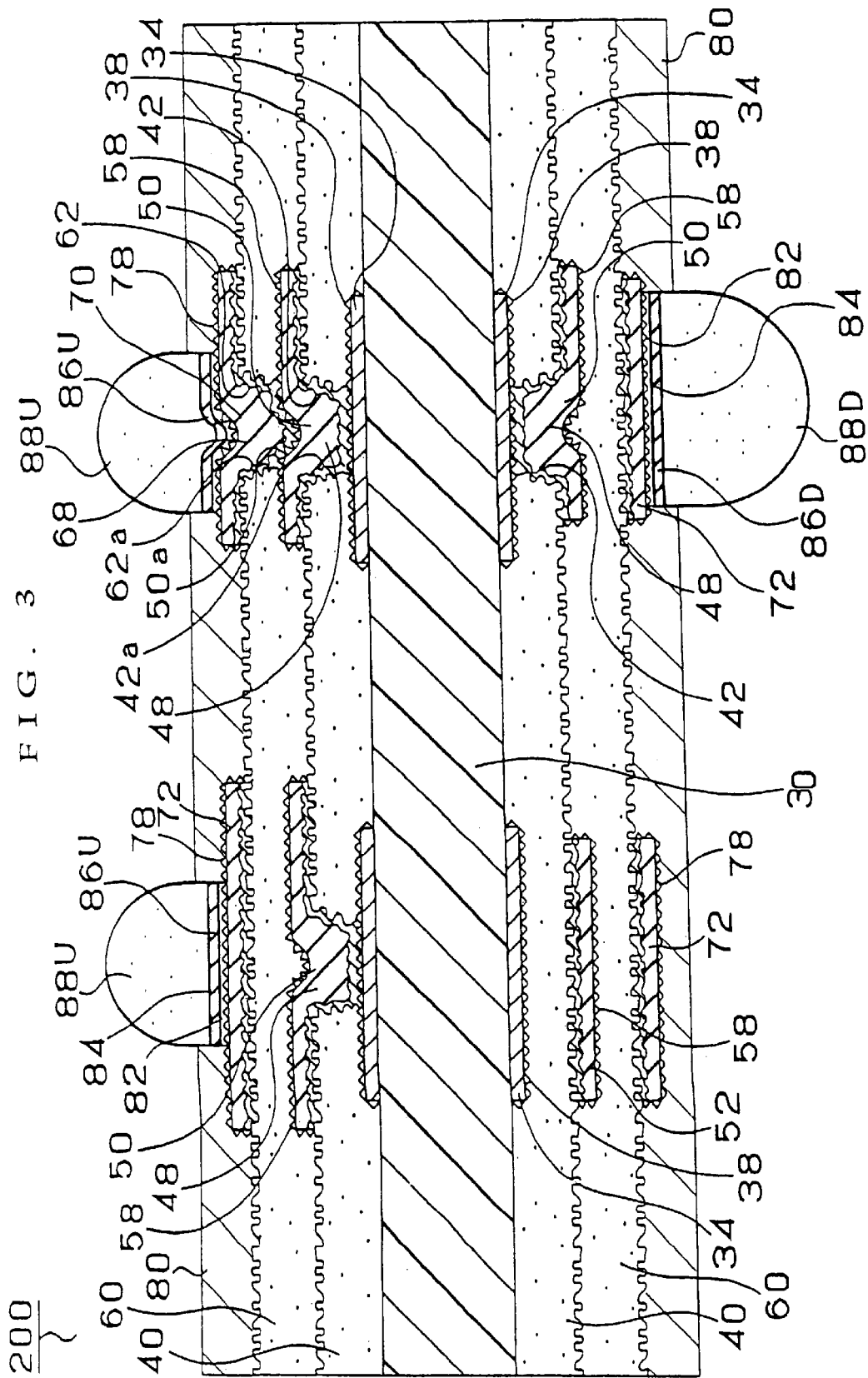
FIG. 3 is a cross sectional view showing a multilayer printed wiring board according to a second embodiment of the present invention.

The multilayer printed wiring board structured as shown in FIG. 3 was subjected to heating tests and heat cycle tests by the inventor of the present invention. The results will now be described. A heating process was performed at 128° C. for 48 hours, and then whether or not the lower via hole 50 and the upper via hole 70 were separated from each other was determined by observing the cross section with an optical microscope. As a result, no separation was observed. Similarly, heat cycles from −55° C. to 125° C. were repeated 1000 times, and then the optical microscope was used to observe the cross section. As a result, no separation was observed. The results of the above-mentioned tests, make it possible to confirm that the multilayer printed wiring board according to this embodiment, having the structure that a coarse layer 58 is interposed, enables the lower via hole 50 and the upper via hole 70 to be firmly joined to each other.

As described above, the multilayer printed wiring boar, according to the second embodiment has the structure that the via holes are directly connected to each other without any wiring. Therefore, the density can be raised. When the lower via hole and the upper via hole are connected to each other, the coarse layer formed on the surface of the lower via hole is interposed. Therefore, the reliability of the connection between the upper and lower via holes can be maintained.

Figure 5:
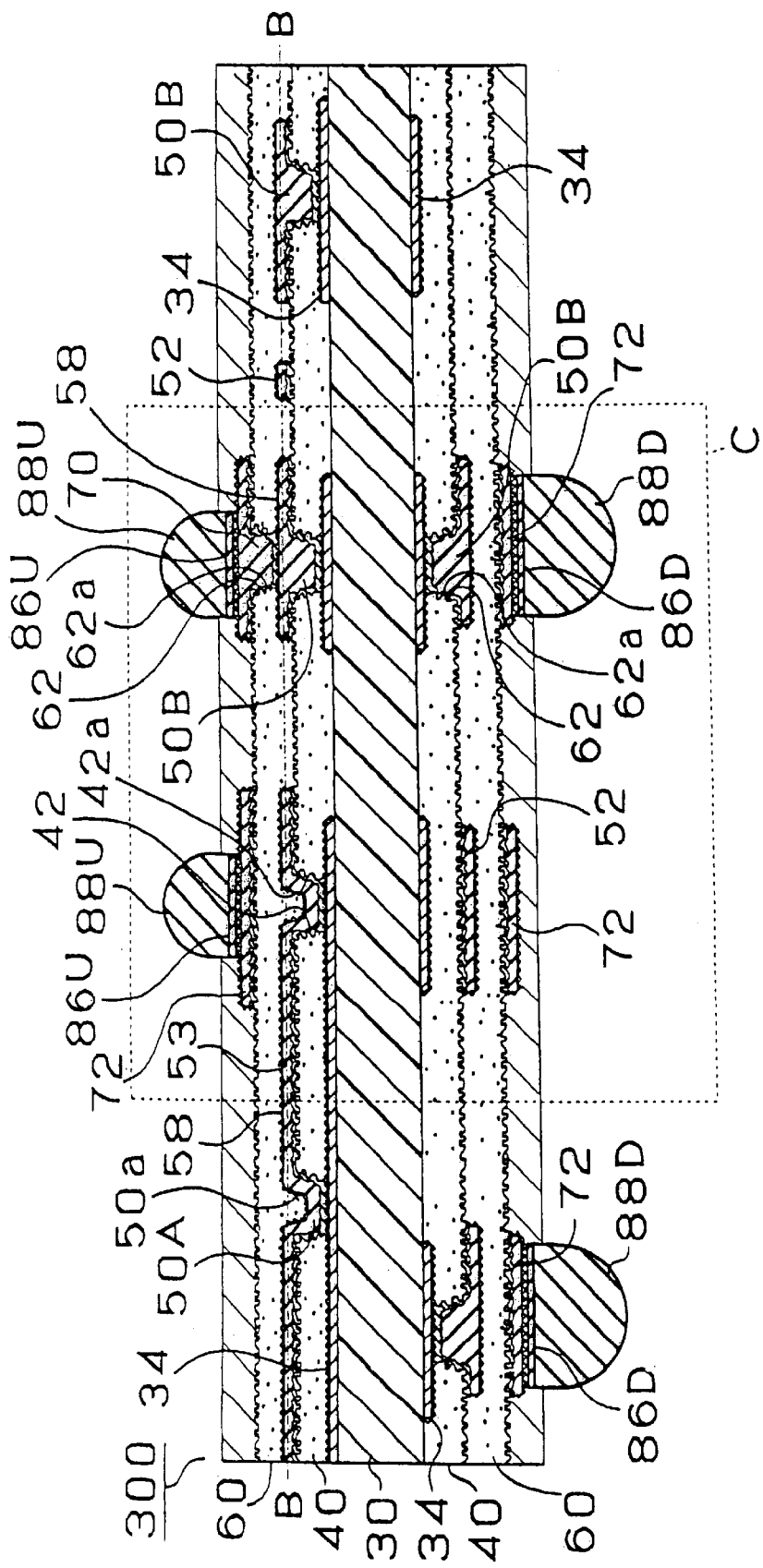
FIG. 5 is a cross sectional view showing a multilayer printed wiring board according to a third embodiment of the present invention.
Figure 11:
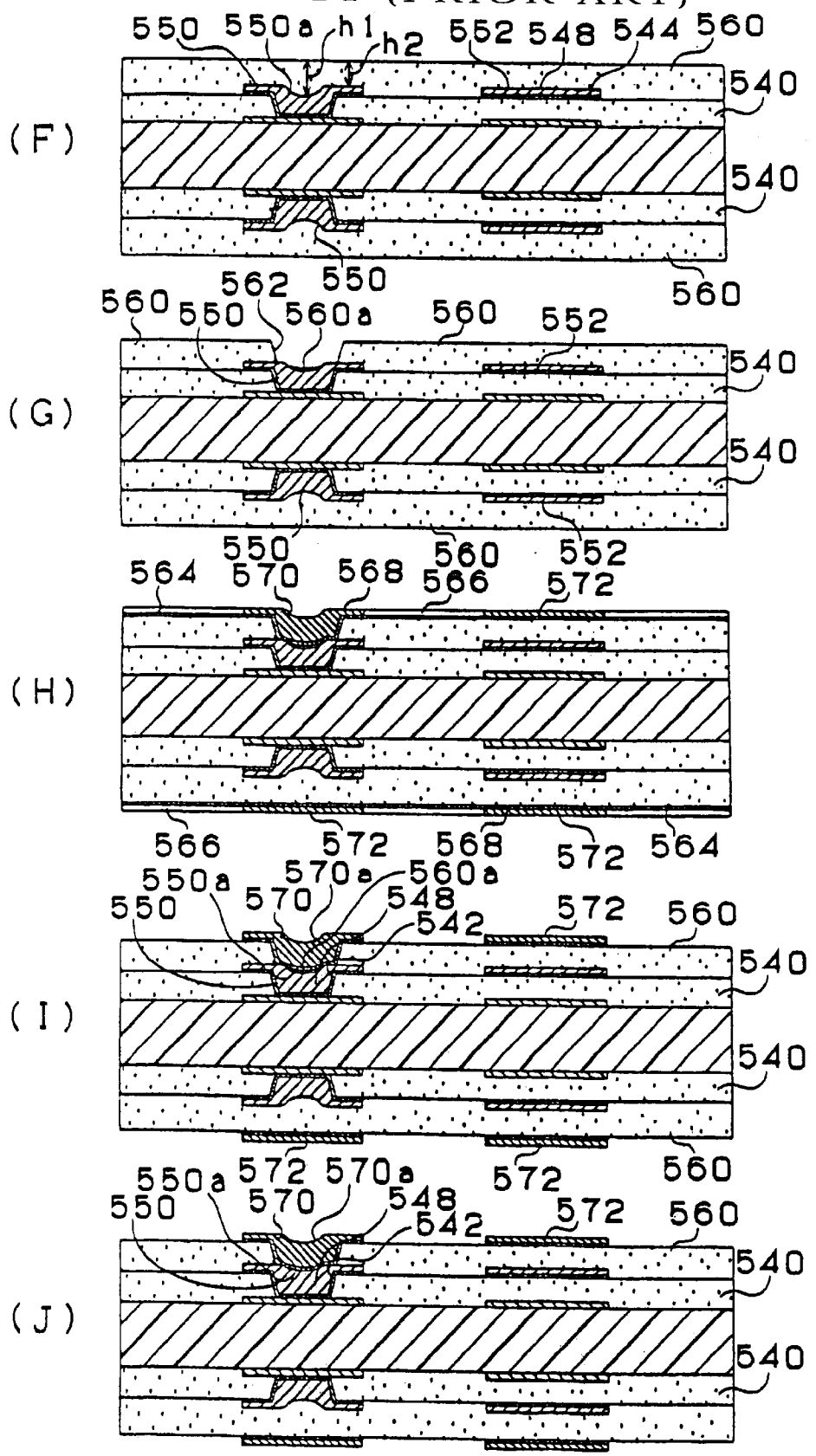
FIG. 11(A) is a cross sectional view showing a conventional multi layer printed wiring board.
FIGS. 11(B), 11(C), 11(D), 11(E) are diagrams showing a process for manufacturing the multilayer printed wiring board according to a conventional multilayer printed wiring board.
FIG. 11(F), 11(G), 11(H), 11(I), 11(J) are diagrams showing a process for manufacturing the conventional multilayer printed wiring board.
Figure 12:
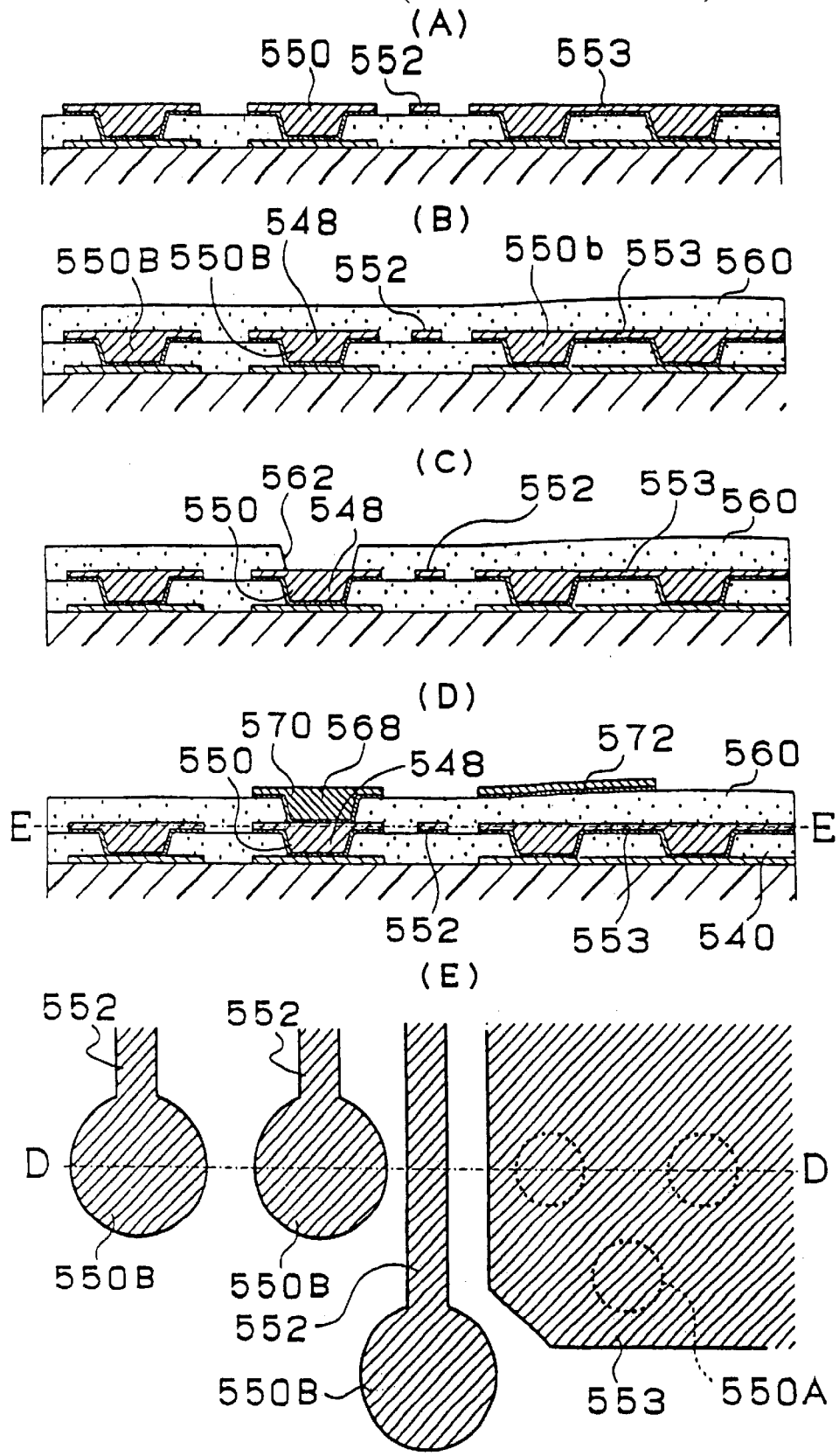
FIGS. 12(A), 12(B), 12(C), 12(D) are diagrams showing a process for manufacturing a conventional multilayer printed wiring board.
Figure 13:
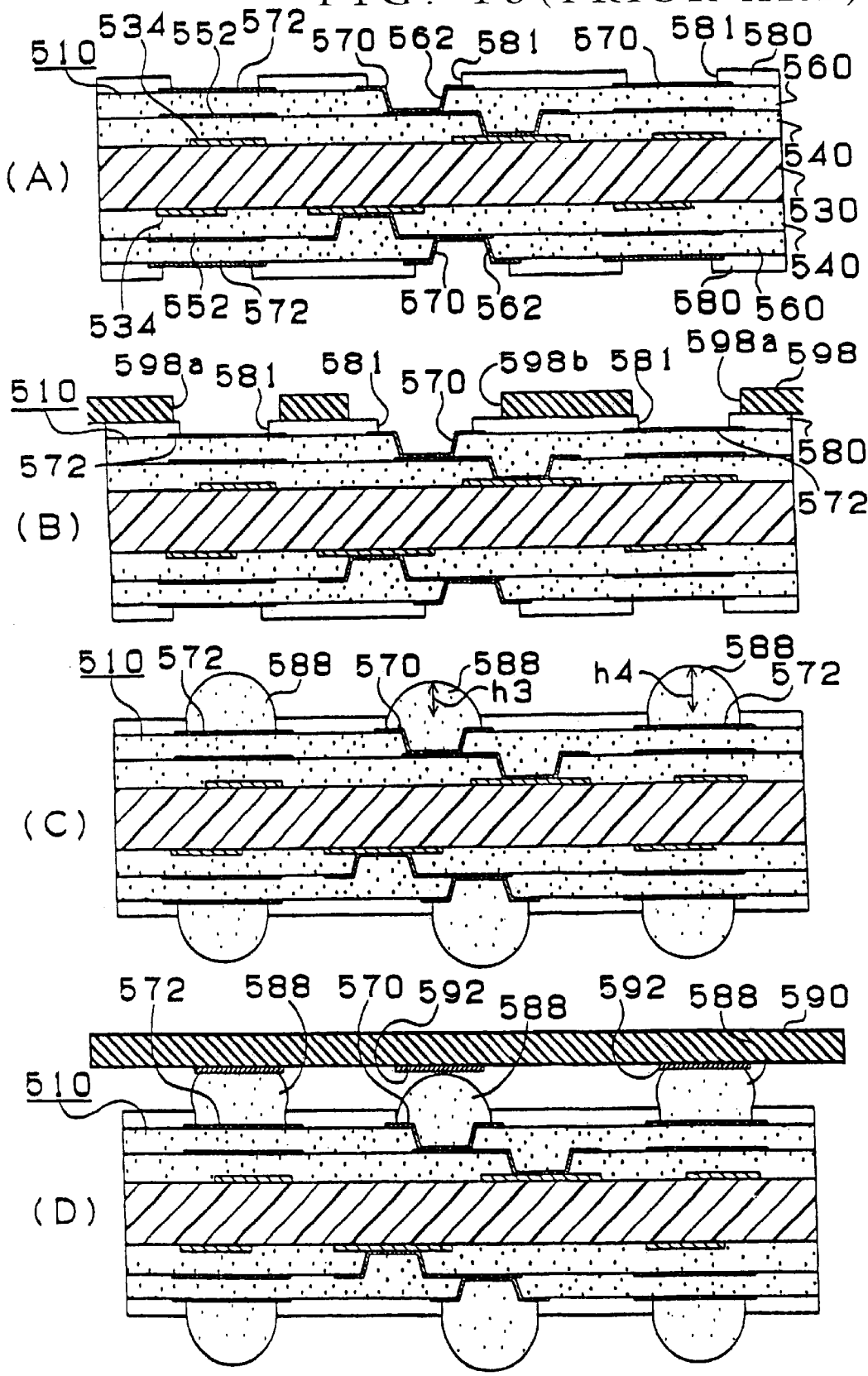
FIGS. 13(A), 13(B), 13(C), 13(D) are diagrams showing a process for manufacturing a conventional multilayer printed wiring board.

The structure of a multilayer printed wiring board according to the third embodiment of the present invention will now be described with reference to FIGS. 11 and 12. FIG. 5 which show the cross section of the multilayer printed wiring board 300 according to the third embodiment. The multilayer printed wiring board 300 is composed as a package board.

Figure 6:
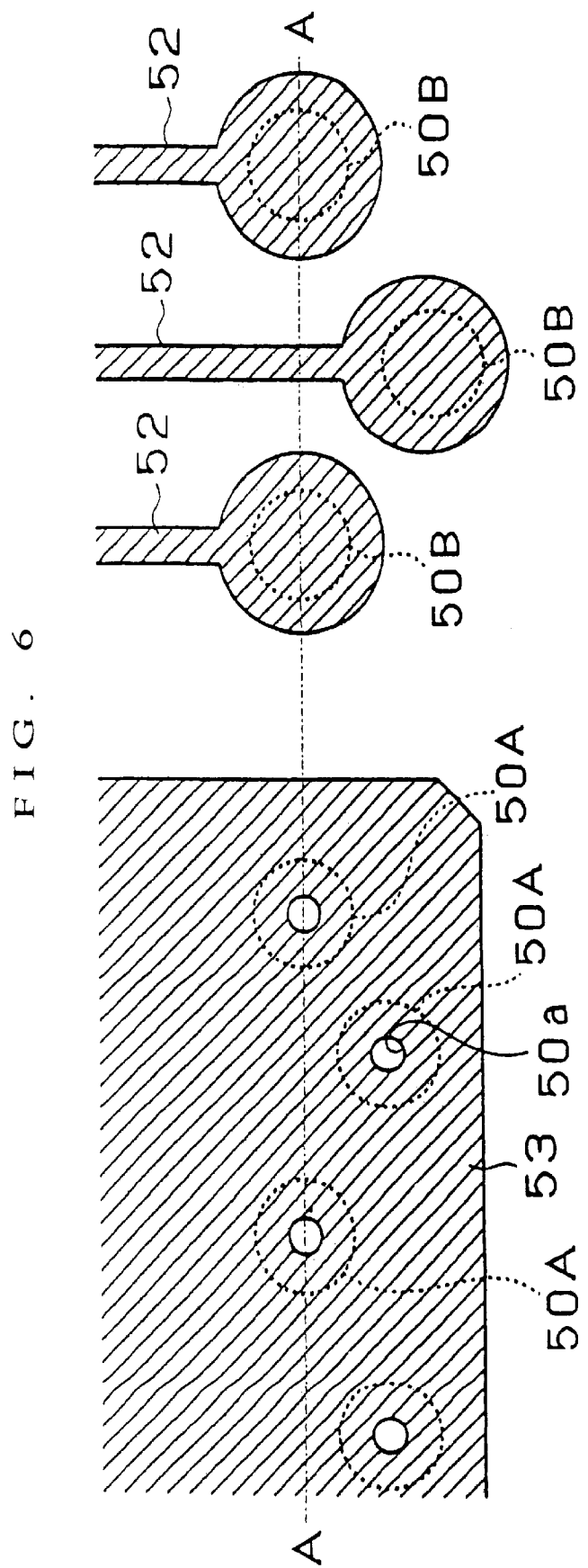
FIG. 6 is a horizontal cross sectional view taken along line B—B shown in FIG. 5.

On the top upper layer of the core board 30 of a multilayer printed wiring board 300 inner layer copper patterns 34 which are used as ground layers are formed. A plain view of an interlaminer resin insulating layer 40 on the inner layer copper patterns 34, i.e. a horizontal cross sectional view taken along line B—B in FIG. 5 is shown in FIG. 6. A perpendicular cross sectional view taken along line A—A corresponds to FIG. 11. As conductor layer on the interlaminer resin insulating layer 40, as shown in FIG. 6, a conductor circuit 52 for forming a signal line, via-hole 50B connected to the conductor circuit 52, a plane layer 53, and via-hole 50A installed in the plane layer 53 are formed. As illustrated in FIG. 5, the via-hole 50A and the via-hole 50B are connected to the lower inner layer copper pattern 34 through the interlaminer resin insulating layer 40. The surface (top surface) of the via-hole 50B connected to the conductor circuit 52 is flat. A recess 50a is formed in the center portion of via-hole 50A existing in the plane layer 53. In the upper layer of the conductor circuit 52 and the plane layer 53, an outermost conductor circuit 72 with an upper interlaminer resin insulating layer 60 and an upper via-hole 70 through the upper interlaminer resin insulating layer 60 is formed. The upper via-hole 70 is directly mounted onto the lower via-hole 50B. On the topside of the conductor circuit 72 and the upper via-hole 70, solder pads 86U for supporting solder bumps 88U are formed. Each IC side solder pad 86U is formed so as to be 133 µm in diameter.

On the bottom of the upper layer of the core board 30 of a multilayer printed wiring board 300, inner layer copper patterns 34 are formed, which are used as ground layers (the upper layer mentioned here means the layer formed on the top surface and the layer formed on the bottom surface of the board 30 respectively). The upper layer of the interlaminer resin insulating layer 40, conductor circuit 52 for forming a signal line, and via-hole 50B connected to the conductor circuit 52, are formed. In the upper layer of the conductor circuit 52, an outermost conductor circuit 72 with an upper interlaminer resin insulating layer 60 and an upper via-hole (not illustrated) is formed. On the top side of the conductor circuit 72 and the upper via-hole (not illustrated), solder pads 86D for supporting solder bumps 88D axe formed. Each mother board side solder pad 86D is formed so as to be 600 µm in diameter.

Since the lower via hole 50 of the multilayer printed wiring board 300 has a flat surface, the smoothness and flatness of the surface of the multilayer printed wiring board can be maintained even if an upper via hole 70 is connected. In the conventional filled-via structure multilayer printed wiring board described with reference to FIG. 11(I), a recess 550a is formed in the lower via hole 550 and a recess 570a is formed in the upper via hole 570. Therefore, deteriorating the smoothness and flatness of the substrate. The multilayer printed wiring board 300 according to this embodiment makes it possible to smooth and flatten the surface of the substrate. Therefore, the mounting reliability of an IC chip when mounted on the multilayer printed wiring board, (a package substrate) can be improved.

Moreover, when resin for forming the interlaminer resin insulating layer 60 above the plane layer 53 is applied during the manufacturing process (to be described later), the resin can be relieved to the inside portion of the recess 50a in the via hole 50A in the plane layer 53. Therefore, this embodiment is different from the conventional multilayer printed wiring board described with reference to FIG. 12(P), in that, the thickness of the interlaminer resin insulating layer 60, above the conductor pattern 52, and the plane layer 53, can be uniformed. Therefore, the surface of the multilayer printed wiring board can be flattened.

Since the recess 50a serving as an anchor is formed in the via hole 50A formed in the plane layer 53, the adhesiveness between the plane layer 53 and the upper interlaminer resin insulating layer 60 can be improved. Therefore, separation (delamination) can be prevented. In particular, the coarse layer 58 formed by the coarse process is formed on the surface of the plane layer 53 including the via hole so that adhesiveness with the upper interlaminer resin insulating layer 60 is improved.

The side surfaces 42a and 62a of the openings 42 and 62 of the lower interlaminer resin insulating layer 40 and the upper interlaminer resin insulating layer 60 are subjected to the coarse process, as shown in the drawing. Therefore, the adhesiveness with the via holes 50 and 70 formed in the openings 42 and 62 can be improved.

It is preferable that the depth of the recess 50a in the via hole 50A provided in the inside portion of the plane layer 53 of the multilayer printed wiring board according to this embodiment, is 5 µm or greater. If the depth is not smaller than 5 µm, a sufficient anchoring effect can be obtained. Thus, the adhesiveness between the plane layer and the upper interlaminer resin insulating layer can be improved so that the interlaminer resin insulating layer 60 is free from any separation. When resin for forming the upper interlaminer resin insulating layer 60 above the plane layer 53 is applied during the manufacturing process (to be described later), resin in a sufficiently large quantity can be relieved into the recess 50a of the via hole 50A in the plane layer 53. Thus, the foregoing interlaminer resin insulating layer can be flattened. It is preferable that the depth of the recess 50a is 50 μm or smaller. If the depth is 50 μm or smaller, the surface of a via hole 50B which is connected to the conductor pattern 52 can be flattened.

The process for manufacturing the package substrate (the multilayer printed wiring board) 300 shown in FIG. 5 is described with reference to FIGS. 13 to 16. To simplify the illustrations, FIGS. 13 to 16 show only a portion surrounded by a chain line shown in FIG. 5. Since steps (1) to (6) for manufacturing the multilayer printed wiring board according to the third embodiment are similar to those according to the first embodiment described with reference to FIGS. 2 and 3, the same steps are omitted from description.

(7) A portion of the substrate 30 having the plating resist 46 formed in step (H) shown in FIG. 2, in which no resist is formed, is subjected to electrolytic copper plating under the following conditions so that a coarse layer 48 having a thickness of 15 μm is deposited. Thus, the inside portion of the opening 42 is filled with plated film (process (I) in FIG. 7).

Conditions of Solution
  coppersulfate. penta-hydrate: 60 g/l
  sulfuric acid: 190 g/l
  chorine ions: 40 ppm
  leveling material (HL manufactured by ATTECI-I): 40 ml/l
  brightener (UV manufactured by ATTECH): 0.5 ml/l Operation Conditions
  bubbling: 3.00 l/minutes
  density of electric current: 0.5 A/dm$^2$
  set electric current: 0.18 A
  duration of plating process: 100 minutes (8) The plating resist 46 is separated and removed with the use of 5% KOH solution, and then the electroless-plated copper film 44 under the plating resist 46 is dissolved and removed by performing an etching process which uses a mixed solution of sulfuric acid and hydrogen peroxide. Thus, a conductor circuit 52 composing electroless-plated copper film 44, electrolytic copper plated film 48, and having a thickness of about 15 μm, and the via hole 50 are formed (process (J) in FIG. 7).

As compared with conventional electrolytic copper plating, the manufacturing method used in this embodiment is structured as such that the quantity of leveling material for smoothing and flattening the plated surface is increased: the quantity of brightener for making the plate surface bright is reduced the set electric current is reduced and the duration for which plating is performed is elongated. That is, electrolytic plating is performed with a small electric current for a long time so that the surface of the via hole 50B (see FIG. 6) which is connected to the conductor pattern 52 is smoothened and flattened. Moreover, a recess 50a is formed in the central portion of the surface of the via hole 50A in the plane layer 53. It is preferable that the plane layer 53 according to the third embodiment is 0.01. dm2 to 10 dm2. Thus, making it possible for a recess can be formed in the surface of the plated layer with which the via hole provided in the plane layer is filled. Moreover, the plated surface of the filled via hole which is connected to the conductor pattern can be flattened.

In this embodiment, the ratio of the diameter of the via hole (diameter of the opening 42: 67 μm) and the thickness (20 μm) of the interlaminer resin insulating layer 40 is set to be 3.35. If the ratio if the diameter of the via hole and the thickness of the interlaminer resin insulating layer is 1 or lower, the depth with respect to the diameter of the opening 42 is too large to permit the plating solution to be sufficiently introduced into the opening 42 in the foregoing plating process. In this case, the plating process cannot efficiently be performed. If the ratio of the diameter of the via hole and the thickness of the interlaminer resin insulating layer is larger than 4, the diameter of the opening for forming the via hole is too large with respect to the depth, causing a recess to be formed in the center, thus a flat surface can not be obtained. Therefore, it is preferable that the ratio of the diameter of the via hole and the thickness of the interlaminer resin insulating layer is larger than 1 and not larger than 4.

It is also preferable that the thickness of the conductor circuit 52 and plane layer 53, are 60 μm or smaller, ideally 20 μm or smaller. The reason for this will now be described. The thickness of the conductor circuit 52 and plane layer 53 are determined by the thickness of the plating resist 46. If the thickness of the plating resist is larger than 60 μm, the resolution deteriorates excessively to deform from the required shape.

Figure 7:
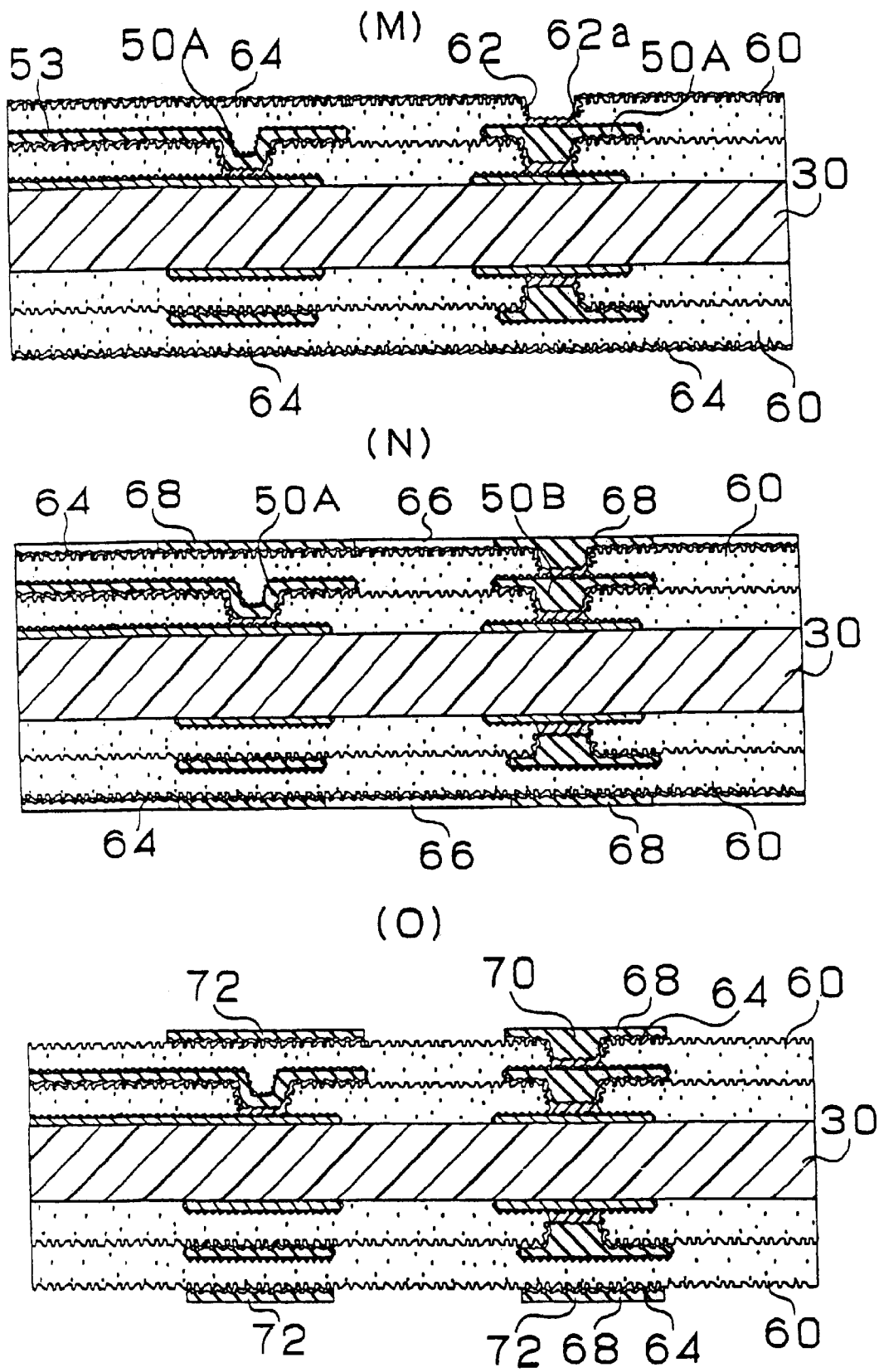
FIGS. 7I to 7R are diagrams showing a process for manufacturing a multilayer printed wiring board according to the third embodiment of the present invention.

(9) The coarse layer 58 is thereafter provided for the conductor circuit 52, plane layer 53 and the via hole 50 of the substrate 30 using the same process as described in step (2) above (process (K) in FIG. 7).

(10) Steps (2) to (8) are repeated so that a further upper conductor pattern is formed. That is, the two sides of the substrate 30 are coated with an adhesive agent 60 for electroless plating, and then the substrate 30 is allowed to stand horizontally. This is followed by; the substrate 30 being dried (process (L1) shown in FIG. 7). When the upper layer of the plane layer 53 is coated with the resin as described above, the resin can be relieved into the recess 50a of the via hole 50A in the plane layer 53. Therefore, making it possible to uniform the thickness of the resin 60 above the conductor circuit 52, from which the resin can be relieved to the adjacent portion, and that above the plane layer 53 from which the resin cannot be relieved to the adjacent portion.

Subsequently, a photo-masking film is securely attached to both surfaces of the board 30, then exposed and developed to form the thickness (20 μm) of the interlaminer resin insulating layer 60 provided with openings (via-holes 62) (process (L2) in FIG. 7). The surface of the interlaminer resin insulating layer 60 is then roughened to form a coarse layer (4 μm depth: process (13) in FIG. 7). A coarse layer is also formed on the side surface 62a of the opening 62. After this, an electroless copper plated film 64 is placed on the roughened surface of the board 30 process (M) in FIG. 7). It is followed by the forming of a plating resist 66 on the electroless copper plated film 64, then by forming of an electrolytic copper plated film 68 on the no-resist-coated portion of the film 66 (process (N) in FIG. 7). The plating resist 66 is removed and the electroless plated film 64 under the plating resist 66 is melted and removed thereby to form conductor circuits 72 as well as upper via-holes 70 (process (O) in FIG. 7). A roughened layer 78 is then formed on the surfaces of the conductor circuits 72 and the upper via-holes 70, then the wiring board is completed (process (P) in FIG. 7).

(11) Solder bumps 88U (133 μm in diameter) are formed on the above-mentioned package substrate and solder bumps 88D are formed under the substrate as per the first embodiment (process (Q), (R) in FIG. 7, see FIG. 5).

The multilayer printed wiring board according to the third embodiment was subjected to PCT tests and heat cycle tests. The results will now be described. The multilayer printed wiring board was subjected to a PCT test in which the multilayer printed wiring board was allowed to stand for 200 hours in an environment in which the pressure was 2 atmospheric pressure, the temperature was 121° C. and the humidity was 100%. As a result, no delamination of the interlaminer resin insulating layer was observed. After heat cycles from –55° C. to 125° C. were repeated 200 times, no delamination of the interlaminer resin insulating layer was observed. That is, the multilayer printed wiring board according to this embodiment has a structure with a recess 50*a* in the via hole 50A which is in the plane layer 53 as described above. Moreover, the surface of the plane layer 53 is subjected to the coarse process so that a coarse layer 58 is formed. Thus, the adhesiveness between the plane layer 53 and the interlaminer resin insulating layer 60 can be improved. As a result, separation (delamination) of the interlaminer resin insulating layer 60 can be avoided.

As described above, the package substrate according to the third embodiment has a structure that has a recess in the via hole in the plane layer. The recess serves as an anchor to improve the adhesiveness between the plane layer and the upper interlaminer resin insulating layer 20 Therefore, separation of the interlaminer resin insulating layer can be prevented. When resin for forming the interlaminer resin insulating layer above the plane layer is applied in the manufacturing process, the resin can be relieved into the recess in the via hole in the plane layer. As a result, the surface of the foregoing interlaminer resin insulating layer, that is, the surface of the interlaminer resin insulating layer can be flattened. Therefore, the mounting reliability when an IC chip or the like is mounted can be improved. Since the via hole which is connected to the conductor pattern has a flat surface, the smoothness and flatness of the surface of the multilayer printed wiring board can be maintained even if an upper via hole is superimposed on a lower via hole.

The structure of a multilayer printed wiring board according to the fourth embodiment of the present invention will now be described with reference to FIGS. 18 (U) and 17. FIG. 8 which show a cross sectional view of the package board, and FIG. 9 shows the package board 400 which is provided with an IC chip 90 mounted thereon and attached to a mother board 95. The package board 400 shown in FIG. 9 (U) is provided with solder bumps 88U on its top surface for connecting to a solder pads 92 of the IC 90 and solder bumps 88D on its bottom surface for connecting to solder pads 96 of the mother board 95. The package board 400 is used as a package board which passes signals between the IC 90 and the motherboard 95.

On the top upper layer and bottom upper layer of the core board 30 of a multilayer printed wiring board 400, inner layer copper patterns 34 and 34, which are used as ground layers (the upper layer mentioned here means a layer formed on the top surface and a layer formed on the bottom surface of the board 30 respectively) are formed. In the upper layer of the inner layer copper pattern 34, a conductor circuit 52, for forming a signal line with an lower interlaminer resin insulating layer 40 therebetween is created. In addition, a lower via-hole 50 is formed through the interlaminer resin insulating layer 40. In the upper layer of the conductor circuit 52 and the lower via-hole 50, an outermost conductor circuit 72 with an upper interlaminer resin insulating layer 25 60, and an upper via-hole 70, which is formed by filling the opening of the upper interlaminer resin insulating layer 60 with copper plating, are formed.

On the topside of the conductor circuit 72 and the upper via-hole 70, solder pads 86U for supporting solder s 88U are formed. Each IC side solder pad 86U is made so as to be 133 μm in diameter. Subsequently, on the bottom side of the conductor circuit 72 and the upper via-hole (not shown), solder pads 86D for supporting solder bumps 88D are formed. Each motherboard side solder pad 86D is formed so as to be 600 μm in diameter. The solder bumps 88U, 88D are formed in the openings (pads) 81 in the solder resist layer 88.

The multilayer printed wiring board according to the fourth embodiment has a structure that contains an opening 62 in the outermost interlaminer resin insulating layer 60, which is filled with plated metal so that a via hole 70 can be formed. The upper via hole 70 is different from the recess-shape via hole 570 of the conventional multilayer printed wiring board described with reference to FIG. 13(A). That is, the height of the surface of the upper via hole 70 is the same as that of the conductor circuit 72 on which the solder bumps are formed. Therefore, when solder paste is printed onto the via hole 70 and the conductor circuit 72 in the same quantities, the height of the solder bumps 88U formed on the upper via hole 70 and that of the solder bumps 88U formed on the conductor circuit 72 can be made to be the same. Therefore, when the IC chip 90 is mounted, the reliability of the connection between the solder pads 92 of the IC chip and the solder bumps 88U of the multilayer printed wiring board 400 can be improved.

Since a recess 70*a* is formed in the central portion of the upper via hole 70, the reliability of the connection between the upper via hole 70 and solder bumps 88U can be improved. Since the coarse layer 78 is formed to be perpendicular to the curved surface of the recess 70*a*, the upper via hole 70 and the solder bumps 88U can firmly be connected to each other even when stress is imposed on the two elements when the temperature of the IC chip 90 has been raised. Thus, the reliability of the connection between the upper via hole 70 and solder bumps 88U can be improved. Since the side surface 62*a* of the opening 62 of the outermost interlaminer resin insulating layer 60 is subjected to the coarse process as shown in the drawing, the adhesiveness with the upper via hole 70 formed in the opening 62 can be improved.

Great stress is imposed when thermal contraction takes place because of the difference between the coefficient of thermal expansion of the via hole 70 made of copper, and that of the interlaminer resin insulating layer 60 having the via hole 70 and made of resin. Therefore, the multi layer printed wiring board 400 has a structure that the outermost interlaminer resin insulating layer 60 is made of a composite material of thermoplastic resin having great tenacity, and thermosetting resin. Thus, occurrence of a crack resulting from the stress can be prevented. Although a composite material of thermoplastic resin and thermosetting resin is employed in this embodiment, thermoplastic resin, such as fluororesin, having great tenacity may be chiefly employed to form the outermost interlaminer resin insulating layer 60.

Since the surface of the conductor circuit 72 is subjected to the coarse process so that a coarse layer 78 is formed, the adhesiveness with the solder bumps 88U which are formed on the conductor circuit 72 can be improved. Moreover, a plated-nickel layer 82 and a plated-gold layer (noble metal layer) 84 are formed on the surface of the upper via hole, 70 which is filled with plated copper, and the conductor circuit 72 formed by copper plating. Therefore, no oxidized film is formed between the surfaces of the upper via hole 70, the conductor circuit 72 made of copper, and the solder bumps 88U. Thus allowing for, the adhesiveness between the via hole, the conductor circuit, and the solder bumps to be improved. Since solder resist 80 covers the portions of the upper via hole 70 and the conductor circuit 72 except for the portion on which solder pads 86U have been formed, solder resist 80 protects the via hole 70 and the conductor circuit 72. Thus, the overall strength of the substrate can be increased. Due to the similarities between the description which has been made about the development of the upper solder bumps 88U on the multilayer printed wiring board 400, the process for creating lower solder bumps 88D, has been omitted.

The process for manufacturing the multilayer printed wiring board shown in FIG. 8 will now be explained with reference to FIG. 9. Since steps (1) to (6) for manufacturing the multilayer printed wiring board according to the fourth embodiment are similar to those according to the first embodiment described with reference to FIGS. 2 and 3, and steps (7) to (10) for manufacturing the multilayer printed wiring board are similar to those according to the second embodiment described with reference to FIGS. 8 to 10, the explanation of the manufacturing steps are omitted.

In the multilayer printed wiring board according to the fourth embodiment, plating is used so as to form a recess 70a in the central portion of the electrolytically plated copper 68, for forming a via-hole 70 as shown process (Q) in FIG. 4 as per the second embodiment. And coarse layers 78 are placed on the surface of the upper via hole 70 and conductor circuit 72. Thus, the package board is completed. In addition, coarse layer 78 is formed to be perpendicular to the curved surface of the recess 70a in the central portion of the via hole 70.

In this fourth embodiment, the ratio of the diameter of the via hole (diameter of the opening 42: 67 $\mu$m) and the thickness (20 $\mu$m) of the outermost interlaminer resin insulating layer 40 is set to be 3.35. If the ratio of the diameter of the via hole and the thickness of the interlaminer resin insulating layer is 1 or lower, the depth with respect to the diameter of the opening 62 is too large to permit plating solution to be sufficiently introduced into the opening 62 in the foregoing plating process. In this case, the plating process cannot efficiently be performed. If the ratio of the diameter of the via hole and the thickness of the interlaminer resin insulating layer is larger than 4, the diameter of the opening for forming the via hole is too large with respect to the depth. Therefore, it is preferable that the ratio of the diameter of the via hole and the thickness of the interlaminer resin insulating layer is larger than 1 and not larger than 4.

It is also preferable that the thickness of the conductor circuit 72 is 40 $\mu$m or smaller, ideally 20 $\mu$m or smaller. The reason for this will now be described. The thickness of the conductor circuit 72 is determined by the thickness of the plating resist 66. If the thickness of the plating resist is larger than 40 $\mu$m, the resolution deteriorates excessively to deform from the required shape.

(11) In step (R) according to the second embodiment shown in FIG. 4, solder pads 86U having a diameter of 133 $\mu$m are formed on the upper surface of the substrate 30. Moreover, solder pads 86D having a diameter of 600 $\mu$m are formed on the lower surface. Then, in step (S) shown in FIG. 9, the solder bump is formed. A metal mask 98 having an opening 98a, and having a thickness of 40 $\mu$m and a diameter of 160 $\mu$m is positioned. Then, solder paste having an average particle size of 20 $\mu$m is printed onto the upper solder pads 86U in the opening 81 of the solder resist layer 80. Similarly, solder paste is printed onto the lower solder pads 86D. It is also necessary that, the surface of the via hole 70 be printed with solder paste in the same quantity as that printed onto the conductor circuit 72 in the process for printing the solder paste. Therefore, the diameters of all of the openings 98a of the metal mask 98 can be made to be the same. Henceforth, comparative to the metal mask 198 having the openings 198a and 198b having a plurality of diameters, in the conventional multilayer printed wiring board described with reference to FIG. 13(B), the metal mask 98 according to this embodiment can easily be formed.

After solder paste has been printed, the substrate 30 is allowed to reflow at 200° C. Thus, solder bumps 88U, having a diameter of 133 $\mu$m, are joined to the upper solder pads 86U. Moreover, solder bumps 88D, having a diameter of 600 $\mu$m are joined to the lower solder bumps 86D. Thus, solder bumps are formed (process (T) in FIG. 9). The surface of the multilayer printed wiring board 400 is then cleaned with surface active agent solution so that fluxes allowed to seep from the solder paste during the reflow process are cleaned.

When the process for cleaning the fluxes is performed, according to the conventional multilayer printed wiring board 510 described with reference to FIG. 13(C), solder paste in large quantities is introduced into the via hole 570. Therefore, fluxes in large quantities are discharged from the solder bumps in the via hole 570. Thus, the fluxes cannot completely be removed by cleaning. On the other hand, the multilayer printed wiring board 400 according to this embodiment has a structure that only a small amount of solder paste is printed onto the via hole 70, similarly to the surface of the conductor circuit 72. Therefore, the fluxes can be completely removed by cleaning.

The conventional multilayer printed wiring board 510 is excessively warped when the reflow process is performed at 200° C. Thus, the accuracy to mount an IC chip is deteriorated. On the other hand, the multilayer printed wiring board 400 according to this embodiment makes it possible to reduce the degree of warp that occurs during the ref low process. The reason for this will now be considered. Since the conventional multilayer printed wiring board 510 has a structure that has a via hole 570 with a hollow structure, the via hole is deformed. On the other hand, this embodiment is structured such, that the via hole 70 is formed by enclosing plated copper 68. Therefore, it can be considered that the via hole 70 is not deformed by dint of heat.

Finally, an IC chip 90 is mounted on the multilayer printed wiring board 400 in such a manner that the solder pads 92 of the IC chip 90 correspond to the solder bumps 88U adjacent to the multilayer printed wiring board. Then, the multilayer printed wiring board 400 is subjected to the ref low process in a heating furnace. Thus, the IC chip 90 is joined to the multilayer printed wiring board 400 (see FIG. 9(U)). Then, surface active agent solution is injected into a portion between the multilayer printed wiring board 400 and the IC chip 90 so that fluxes allowed to seep from the solder paste when the reflow process was performed can be removed by cleaning.

When the process of cleaning fluxes is performed, the surface active agent solution must be injected into a small space between the multilayer printed wiring board 400 and the IC chip. Therefore, the conventional multilayer printed wiring board 510 described with reference to FIG. 13(D) has difficulty in completely cleaning fluxes of the solder bumps provided for the via hole 570. On the other hand, the multilayer printed wiring board 400 according to this embodiment has the structure that solder paste, in only a small quantity is printed onto the via hole 70, similarly to the surface of the conductor circuit 72. Therefore, fluxes can completely be removed by cleaning.

After the reflow process has been performed, resin is introduced into a space between the multilayer printed wiring board 400 and the IC chip so that the space is sealed with resin. Then, the overall body of the IC chip 90 is covered with resin, that is, the IC chip 90 is molded with resin (not shown). Then, the multilayer printed wiring board on which the IC chip 90 has been mounted is joined to a mother board 95 (see FIG. 9(U)).

Figure 10:
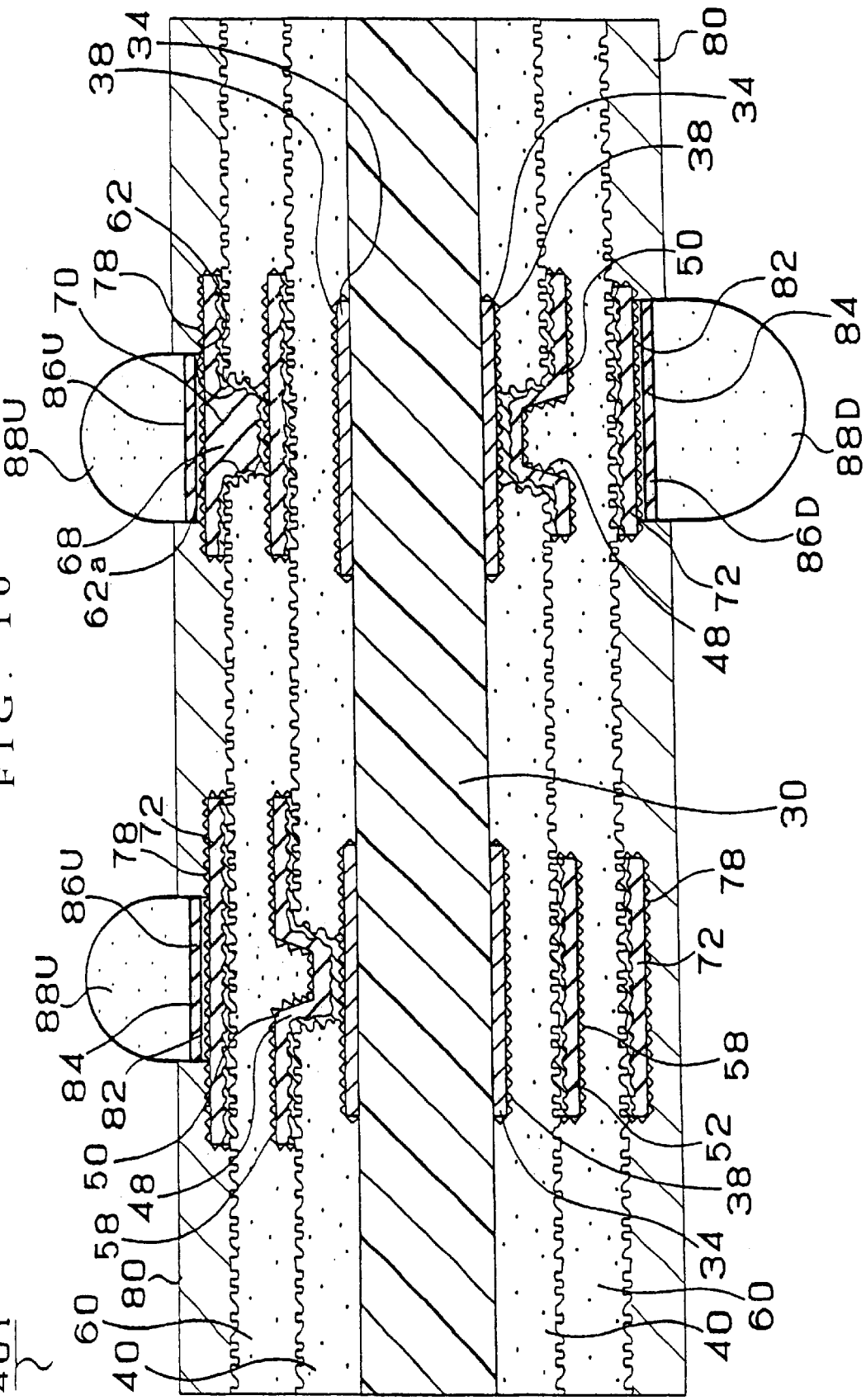
FIG. 10 is a cross sectional view showing a multilayer printed wiring board according to a modification of the fourth embodiment of the present invention.

FIG. 10 shows a multilayer printed wiring board 401 according to the modification of the fourth embodiment of the present invention. The multilayer printed wiring board according to the fourth embodiment described with reference to FIG. 8 has a structure that has plated copper 5 enclosed in the lower via hole 40 formed in the lower interlaminer resin insulating layer 40 as well as the upper via hole 70 on which solder bumps are formed. On the other hand, the multilayer printed wiring board according to this modification has a structure that resin is enclosed in the lower via hole 50 as per a conventional structure described with reference to FIG. 13. The upper via hole 70 according to the fourth embodiment has a recess 70a in the central portion thereof. On the other hand, the upper via hole 70 according to the modification has a smooth and flat surface. The fourth embodiment has a structure that a gold plated layer 84 is formed on the upper surfaces of the upper via hole 70 and the conductor circuit 72. On the other hand, the modification has a structure that a platinum plated layer 84 is formed. Also the foregoing modification is able to improve the reliability of the connection of the solder bumps 88U and 88D similarly to the fourth embodiment.

As described above, the multilayer printed wiring board according to the fourth embodiment having a structure that plated metal is enclosed in the opening, makes the height of the surface of the via hole to be the same as the height of the conductor circuit on which the solder bumps are formed. Therefore, solder paste in equal quantities is printed onto the via hole and the conductor circuit so that the heights of the solder bumps formed on the via hole, and the solder bumps formed on the conductor circuit, are made to be the same. As a result, the reliability of the connection of the solder bumps can be improved.

Although the first to fourth embodiments have been described with reference to a package substrate, which is formed by a semi-additive method, the structure of the present invention may be applied to a package substrate which is formed by a full additive method. Although the above-mentioned embodiments have been described with reference to a package substrate of a multilayer printed wiring board, the structure of the present invention may, of course, be applied to a multilayer printed wiring board other than a package substrate.

In the above embodiments, the plated metal is enclosed in the opening. Instead of the plated metal, conductive paste may be enclosed. The DD paste (AE16001) made by TATUTA DENSEN can be used as the conductive paste.

What is claimed is:

1. A multilayer printed wiring board comprising:
   interlaminer resin insulating layers; and
   conductor circuits constructed and arranged such that said interlaminer resin insulating layers and said conductor circuits are alternately stacked, wherein
   an opening is formed in a lower interlaminer resin insulating layer, said opening is filled with metal so that a lower via hole having a flat surface is formed, a surface of said lower via hole is subjected to a coarse process, and an upper via hole is formed above said lower via hole.

2. A multilayer printed wiring board according to claim 1, wherein a side surface of said opening of said lower interlaminer resin insulating layer is subjected to a coarse process.

3. A multilayer printed wiring board according to claim 1, wherein surfaces of said upper via hole and said conductor circuit are subjected to a coarse process.

4. A multilayer printed wiring board according to claim 1, wherein said lower interlaminer resin insulating layer is made of a composite material of thermoplastic resin and thermosetting resin or mainly made of a thermoplastic resin.

5. A multi layer printed wiring board according to claim 1, wherein said lower via hole is structured such that a ratio of a diameter of said via hole and the thickness of said interlaminer resin insulating layer is higher than 1 and not higher than 4.

6. A multilayer printed wiring board comprising:
   interlaminer resin insulating layers; and
   conductor circuits such that said interlaminer resin insulating layers and said conductor circuits are alternately stacked, wherein
   an opening is formed in a lower interlaminer resin insulating layer, said opening is filled with metal so that a lower via hole is formed, and an upper via hole is formed above a coarse layer formed on a surface of said lower via hole.

7. A multilayer printed wiring board according to claim 6, wherein a recess is formed in a central portion of said lower via hole.

8. A multilayer printed wiring board according to claim 6, wherein a side surface of said opening of said lower interlaminer resin insulating layer is subjected to a coarse process.

9. A multilayer printed wiring board according to claim 6, wherein surfaces of said upper via hole and said conductor circuit are subjected to a coarse process.

10. A multilayer printed wiring board according to claim 6, wherein said lower interlaminer resin insulating layer is made of a composite material of thermoplastic resin and thermosetting resin or mainly made of thermoplastic resin.

11. A multilayer printed wiring board according to claim 6, wherein said lower via hole is structured such a the ratio of a diameter of said via hole and thickness of said interlaminer resin insulating layer is higher than 1.

12. A multilayer printed wiring board comprising:
   interlaminer resin insulating layers and
   conductor layers such that said interlaminer resin insulating layers and said conductor circuits are alternately stacked, wherein
   at least one of said conductor layers has a plane layer including a conductor pattern, which is connected to a via hole, and said via hole,
   said via hole which is connected to said conductor pattern is filled with metal so that surface of said via hole is flattened, and
   said via hole formed in said plane layer is filled with metal and a recess is formed in surface of said via hole formed in said plane layer,
   wherein a surface of said plane layer including said via hole is subjected to a coarse process.

13. A multilayer printed wiring board according to claim 12, wherein side surfaces of said via hole connected to said conductor pattern and a side said opening of said interlaminer resin insulating layer in which said via hole is formed in said plane layer are subjected to a coarse process.

14. A multilayer printed wiring board according to claim 12, wherein depth of said recess of said via hole formed in said plane layer is 5 $\mu$m to 50 $\mu$m.

15. A multilayer printed wiring board according to claim 12, wherein area of said plane layer is 0.01 dm$^2$ to 10 dm$^2$.

16. A multilayer printed wiring board incorporating interlaminer resin insulating layers and conductor circuits such that said interlaminer resin insulating layers and said conductor circuits are alternately stacked, said multilayer printed wiring board comprising:

solder bumps formed on a conductor circuit formed on an outermost interlaminer resin insulating layer; and solder bumps formed on a via hole formed by enclosing metal in an opening formed in said outermost interlaminer resin insulating layer of which the height of the surface of the via hole is made to be the same as the height of the conductor circuit on which solder bumps are formed.

17. A multilayer printed wiring board according to claim 16, wherein a recess is formed in central portion of said via hole.

18. A multilayer printed wiring board according to claim 16, wherein a side surface of said opening of said outermost interlaminer resin insulating layer is subjected to a coarse process.

19. A multilayer printed wiring board according to claim 16, wherein surfaces of said via hole and said conductor circuit on said outermost layer are subjected to a coarse process.

20. A multilayer printed wiring board according to claim 16, wherein a metal layer structured such that a noble metal layer is provided for at least a surface thereof is formed on a surface of said via hole, and solder bumps are formed on said noble metal layer.

21. A multilayer printed wiring board incorporating interlaminer resin insulating layers and conductor circuits such that said interlaminer resin insulating layers and said conductor circuits are alternately stacked, said multilayer printed wiring board having:

solder bumps formed on a via hole formed by enclosing metal in an opening formed in said interlaminer resin insulating layer of which the height of the surface of the via hole is made to be the same as the height of the conductor circuit on which solder bumps are formed.

* * * * *